(12) United States Patent
Pradhan et al.

(10) Patent No.: US 12,288,979 B2
(45) Date of Patent: Apr. 29, 2025

(54) METHOD, DEVICE, AND SYSTEM FOR ADAPTING DISTANCE PROTECTION AGAINST REACTANCE EFFECT DUE TO REMOTE INFEED AND FAULT RESISTANCE

(71) Applicant: Hitachi Energy Ltd, Zürich (CN)

(72) Inventors: Vedanta Pradhan, Bhubaneswar (IN); Od Naidu, Karnataka (IN)

(73) Assignee: HITACHI ENERGY LTO, Zürich (CH)

( * ) Notice: Subject to any disclaimer, the term of this patent is extended or adjusted under 35 U.S.C. 154(b) by 204 days.

(21) Appl. No.: 18/132,789

(22) Filed: Apr. 10, 2023

(65) Prior Publication Data
US 2023/0327426 A1   Oct. 12, 2023

(30) Foreign Application Priority Data

Apr. 11, 2022  (IN) .............................. 202241021576
May 27, 2022  (EP) .................................... 22175910

(51) Int. Cl.
| H02H 7/22 | (2006.01) |
| G01R 31/08 | (2020.01) |
| H02H 1/00 | (2006.01) |

(52) U.S. Cl.
CPC .......... *H02H 7/226* (2013.01); *G01R 31/085* (2013.01); *G01R 31/088* (2013.01); *H02H 1/0092* (2013.01)

(58) Field of Classification Search
CPC .. G01R 31/088; G01R 31/085; H02H 1/0092; H02H 3/40; H02H 7/226; H02H 7/26
(Continued)

(56) References Cited

U.S. PATENT DOCUMENTS

| 4,841,405 A | * | 6/1989 | Udren | ...................... H02H 3/40 |
| | | | | 702/58 |
| 5,796,258 A | * | 8/1998 | Yang | ...................... H02H 3/402 |
| | | | | 324/521 |

(Continued)

FOREIGN PATENT DOCUMENTS

| EP | 1982395 B1 | 11/2017 |
| JP | 2016029870 A | 3/2016 |

OTHER PUBLICATIONS

Makwana et al., "A New Digital Distance Relaying Scheme for Compensation of High-Resistance Faults on Transmission Line", IEEE Transactions On Power Delivery, vol. 27, No. 4, Oct. 2012, pp. 2133-2140.

(Continued)

*Primary Examiner* — Kevin J Comber
(74) *Attorney, Agent, or Firm* — Procopio, Cory, Hargreaves & Savitch LLP.

(57) ABSTRACT

The present disclosure relates to a method for controlling a distance protection system, as well as a respective device and system for performing the method. Measurements are received. The measurements comprise current and/or voltage measurements at a first position along a transmission line for an electrical power system. A first impedance is computed from the received measurements. A fault location is determined from the computed first impedance and a first impedance boundary. Responsive to the determined fault location, a second impedance is computed. The fault location is redetermined from the computed second impedance and the first impedance boundary. The distance protection system is controlled based on the determined fault location or the re-determined fault location.

18 Claims, 13 Drawing Sheets

(58) Field of Classification Search
USPC .......................................................... 361/78
See application file for complete search history.

(56) References Cited

U.S. PATENT DOCUMENTS

| | | | | |
|---|---|---|---|---|
| 6,661,630 | B1* | 12/2003 | Ahn | ........................ H02H 7/26 |
| | | | | 361/81 |
| 2009/0021878 | A1* | 1/2009 | Saha | ...................... G01R 31/52 |
| | | | | 361/81 |
| 2020/0348352 | A1* | 11/2020 | Gajare | ................. G01R 31/086 |

OTHER PUBLICATIONS

Ma et al., "An Adaptive Distance Protection Scheme Based on the Voltage Drop Equation", IEEE Transactions On Power Delivery, vol. 30, No. 4, Aug. 2015, pp. 1931-1940.

Liang et al., "A Novel Fault Impedance Calculation Method for Distance Protection Against Fault Resistance", IEEE Transactions On Power Delivery, vol. 35, No. 1, Feb. 2020, pp. 396-407.

Eriksson et al., "An Accurate Fault Locator With Compensation For Apparent Reactance In The Fault Resistance Resulting From Remote-End Infeed", IEEE Power Engineering Society, Power System Relaying Committee, IEEE Transactions on Power Apparatus and System, vol. PAS-104, No. 2, Feb. 1985, pp. 424-436.

Anderson et al., "Analysis of Distance Protection", Power System Protection, Wiley-IEEE Press, 1999, pp. 379-417.

Pradhan et al. "Decentralized Estimation of Two-Port Equivalents for Power Transmission Lines", IEEE Access, vol. 9, 2021, pp. 68223-68239.

Pradhan et al. "Adaptive Distance Relay Based on Estimation And Update of Two-Port Equivalent Across Transmission Lines", 2021 9th IEEE International Conference on Power systems (ICPS), 978-1-6654-2873-6/21/$31.00 2021 IEEE, DOI: 10.1109/ICP552420.2021.9670091.

Paladhi et al., "Adaptive Zone-1 Setting Following Structural and Operational Changes in Power System", IEEE Transactions on Power Delivery, vol. 33, No. 2, Apr. 2018, pp. 560-569.

* cited by examiner

| $E_M$ in kV | $E_N$ in kV | $Z_{dM1}$ in Ω | $Z_{dM1}$ in Ω | $Z_{sM0}$ in Ω | $Z_{sN0}$ in Ω |
|---|---|---|---|---|---|
| -217.94+j2.18 | -174.70+j37.37 | 23.81+j50.47 | 4.23+j16.82 | 45.18+j65.75 | 18.46+j32.16 |

FIG. 8

METHOD, DEVICE, AND SYSTEM FOR ADAPTING DISTANCE PROTECTION AGAINST REACTANCE EFFECT DUE TO REMOTE INFEED AND FAULT RESISTANCE

CROSS-REFERENCE TO RELATED APPLICATIONS

The present application claims priority to Indian Application No. 202241021576, filed on Apr. 11, 2022, and European Application No. 22175910.3, filed on May 27, 2022, which are both hereby incorporated herein by reference as if set forth in full.

TECHNICAL FIELD

The present disclosure relates to a method, a device, and a system for controlling a distance protection system comprising a distance protection device located at a first position along a transmission line for an electrical power system.

BACKGROUND

A distance protection is widely used to detect a fault and to prevent the fault from propagating through a transmission line in an electrical power system. A distance protection comprises a relay located at a terminal measuring local bus/node voltage and/or line current of three phases. An apparent impedance, or a relay impedance, seen from the terminal to the portion of the transmission line to be protected is computed based on the measured terminal voltages and currents. In case a fault is a bolted short circuit, i.e., if the fault resistance is zero, said apparent impedance is proportional to the distance between the terminal and the ground fault location. Accordingly, the distance protection computes the fault location and controls an appropriate relay when the fault location falls within said relay's zone of operation. Typically, a distance protection comprises multiple zones such as Zone-1, Zone-2, Zone-3, and so on to provide main, as well as coordinated back-up protection, for relays on the upstream/downstream lines.

FIG. 1a) illustrates an overview of a distance protection and a protected transmission line. The transmission line 'L' 100 is terminated by bus/terminal 'M' 110 comprising a relay 111 measuring current using a current transformer, CT, and voltage using a potential transformer, PT. The transmission line 'L' 100 is further terminated by bus/terminal 'N' 120 and is divided into comprises multiple zones such as Zone-1 131, Zone-2 132, and Zone-3 133. A dependable operation requires the relay 111 to reliably detect if a fault has occurred in one of its zones 131, 132, and 132. A secure operation requires the relay 111 to be selective in detecting a fault in its corresponding zone 131, 132, or 132. For example, fault F1 should be detected as a Zone-1 131 fault by the relay 111 at bus 'M' 110, while fault F2 should be detected as Zone-2 132 fault.

In reference to FIG. 1a), a fault at location 'F1' on the protected transmission line 'L', the distance relay at bus 'M' measures the apparent impedance $Z_R$ as follows:

$$Z_R = \frac{V_R}{I_R} \quad (1)$$

wherein $V_R$ and $I_R$ are predefined relay voltage and relay current respectively which are derived from the voltages and currents which are measured at the relay 111. If the fault is a bolted short circuit, i.e., if the fault resistance is zero and the fault point/location on the transmission line is at the electrical ground potential, the measured apparent impedance $Z_R$ corresponds to the faulted line segment impedance $dZ_{1L}$ as it is the only impedance which opposes the relay current flowing between terminal 'M' 110 and the ground through the fault. Here, 'd' is the per unit distance of the fault from the relay terminal 'M' 110 and $Z_{1L}$ is the positive sequence impedance of the line 'L' 110.

This is however not true for the case of a resistive fault as the fault point on the line is no longer at ground potential. Therefore, the relay voltage and current are related via a more complex relationship in terms of $dZ_{1L}$, fault resistance $R_F$, the fault current $I_F$ or the current contribution $I_{rem}$ from the remote side 'N' 120 to the fault. The measured relay impedance $Z_R$ can be described in a form which consists of the faulted line segment impedance $dZ_{1L}$ and an additional deviation term $\Delta Z_R$ as follows:

$$Z_R = dZ_{1L} + \Delta Z_R = dZ_{1L} + \frac{V_F}{I_R} = dZ_{1L} + \frac{I_F}{I_R}R_F = dZ_{1L} + \frac{(I_R + I_{rem})}{I_R}R_F. \quad (2)$$

The measured relay impedance $Z_R$ is compared to a complex R-X (real-imaginary) plane comprising boundaries corresponding to each of the zones 131, 132, and 133, herein referred to as operating characteristics or distance relay characteristics, to determine a fault location to ascertain a certain level of dependability against deviating impedance term. FIG. 1b) illustrates the distance relay characteristics including a first base boundary 151, a second base boundary 152, and a third base boundary 153 of impedance.

As evident from eq.(2), the magnitude and the phase angle of the deviation in the measured relay impedance $Z_R$ are dependent on the fault resistance and the current contributions from the terminals into the fault. Both these parameters can vary widely depending on the nature and cause of the fault, and on the pre-fault line loading conditions. Therefore, a relay characteristic designed offline may not hold good in actual system operation. For example, a quadratic relay characteristic is typically designed to have an additional resistive coverage on the R-X plane as illustrated in FIG. 1b), which assumes that the deviation impedance is predominantly resistive. However, depending on the actual fault scenario, the deviation impedance can be significantly reactive to escape the relay reactive reach boundary as well. Therefore, there is a need to adapt the distance relay operation to improve its dependability under such circumstances.

To this end, the Zone-1 trip characteristic of the relay may be modified from its base design so that the relay detects faults reliably using a two-port equivalent model across the protected transmission line as illustrated in FIG. 2. The two-port equivalent model across the protected transmission line comprises a first source 211 and a second source 221 with their respective source impedances $Z_{sM}$ 212 and $Z_{sN}$ 222 as well as their voltage parameters ($E_M$, $E_N$, and $\delta$). The line segment between bus 'M' 110 and bus 'N' 120 are modeled in terms of $dZ_{1L}$, $(1-d)Z_{1L}$, and $R_F$. Said modification may be performed by analyzing the possible loci of the apparent impedance under varying fault parameters such as fault location 'd' and fault resistance '$R_F$', resulting in a modified Zone-1 trip characteristic 301 (or equivalently an adapted first base boundary 301) as illustrated in FIG. 3. However, such modification requires the model parameters such as the source impedances ($Z_{sM}$ 212 and $Z_{sN}$ 222) and the source voltage parameters ($E_M$, $E_N$, and $\delta$) which describe the pre-fault operating conditions accurately. Further, the adapted first based boundary 301 may overlap with the overreaching Zone-2 characteristic (or equivalently the second base boundary 152), as illustrated in FIG. 3, which in turn could lead to an insecure relay operation.

Alternatively, only the tilt angle of the reactive reach boundary in a quadratic relay characteristic may be adjusted. The angle for the modification may be obtained based on the measured relay current and a substitute for the fault current. For e.g., for an A-G fault, the negative sequence current at the relay may be used as a proxy for the fault current and the angle may be obtained by subtracting the phase angle of the relay current and phase angle of the negative sequence relay current. Although such a method leads to minimal adjustments on the Zone-1 trip characteristic, it is approximate in its choice for a suitable proxy. Moreover, the simplistic modification may not account for the remote infeed adequately.

Alternatively, the trip characteristic of the relay may be left unchanged, while the apparent impedance calculation may be modified in way which compensates for the deviation impedance. FIG. 4 illustrates an adapted apparent impedance calculation of a distance protection. In particular, FIG. 4a) and FIG. 4b) illustrate the computation of the apparent impedance $Z_R$ on the complex plane when the deviation impedance is inductive and capacitive, respectively. The deviation impedance $\Delta Z_R$ is related to the apparent impedance $Z_R$ as follows:

$$\Delta Z_R = \frac{|Z_R|\sin(\phi_{1L} - \phi_R)}{\sin(\phi_{1L} - \phi_\Delta)} e^{j\phi_\Delta} \tag{3}$$

Assuming that the line impedance parameters are known, the deviation impedance can be calculated if the phase angle $\phi_\Delta$ of the deviation impedance can be determined. The phase angle $\phi_\Delta$ of the deviation impedance is can be derived from eq.(2) as follows:

$$\Phi_\Delta = \arg\left(\frac{I_F}{I_R} R_F\right) = \arg\left(\frac{I_F}{I_R}\right) = \arg(I_F) - \arg(I_R), \tag{4}$$

wherein arg(X) denotes a mathematical notation of the argument of a complex number X. It is noted that $R_F$ is a real valued number, hence arg($R_F$)=0. Eq.(4) implies that in order to determine $\phi_\Delta$, phase angle of the fault current must be known. $R_F$ is considered to be a real-valued entity, when deriving the eq.(3). Fault current $I_F$ is not a directly measurable quantity. It can be approximated as a sum of the current contributions from bus 'M' 110 and bus 'N' 120 side during a fault on the line. However, this will additionally require a time-synchronized communication of the remote end current at the relay terminal 120, which is not a default feature of the distance relay. The fault current can also be determined in relation to the incremental current measured by the relay. For example, for an A-G fault (or a phase to ground fault in general), it can be shown that:

$$\arg(I_F) = \arg\left(\frac{\Delta I_{Ma1}}{D1}\right), \tag{5}$$

wherein $\Delta I_{Ma1}$ is the superimposed or incremental positive sequence current measured at the relay due to the fault and $I_{fa1}$ is the positive sequence fault current, and wherein $$D1 = \frac{\Delta I_{Ma1}}{I_{fa1}} = \frac{(1-d)Z_{1L} + Z_{sN1}}{Z_{sM1} + Z_{1L} + Z_{sN1}}. \tag{6}$$

However, fault location 'd' is still an unknown in eq.(6), and therefore obtaining arg($I_F$) is not straightforward.

Assuming that the system is homogeneous, i.e., the phase angles of the source impedances $Z_{sM}$ 212 and $Z_{sN}$ 222 are approximately equal to that of the line impedance, D1 of eq.(6) can be approximated to be a real number, at the cost of eliminating the source impedances from the calculations. This leads to the following expression:

$$\arg(I_F) \approx \arg(\Delta I_{Ma1}) \tag{7}$$

Such approximation of $I_F$ can be derived for any other fault type such as phase-to-phase, phase-to-phase-to-ground and three-phase faults. The appropriate formula must be used corresponding to the fault type (or phase) classification.

Alternatively, the phase angle $\phi_\Delta$ of eq.(4) may be assumed to be zero, i.e., it is assumed that the current contributions from both the ends into the fault have the same phase angle. Such assumption may be valid if the system is truly homogeneous. However, homogeneity of the system is not a guarantee in any interconnected power system, more so, in the evolving paradigm of systems with renewable generation.

Alternatively, fault location 'd' may be estimated based on single-ended measurements by iteratively estimating a fault location 'd', then calculating the deviation impedance phase angle and the deviation impedance $\Delta Z_R$ to rectify the apparent impedance $Z_R$ till a convergence is reached and no more rectification of the apparent impedance is required. While such estimation does not make any assumptions about the nature of the system, convergence can be an issue if the deviation impedance is large.

SUMMARY

Thus, there is a need to improve a method, a device, and a system for adapting distance protection against reactance effect due to remote infeed and fault resistance.

The present disclosure relates to methods, devices, and systems for controlling a distance protection system. In particular, the methods of the present disclosure may be computer-implemented.

The present disclosure relates to a method for controlling a distance protection system, the method comprising: receiving, measurements comprising current and/or voltage measurements at a first position along a transmission line for an electrical power system; computing a first impedance from the received measurements; determining a fault location from the computed first impedance and a first impedance boundary; computing, responsive to the determined fault location, a second impedance; re-determining the fault location from the computed second impedance and the first impedance boundary; and controlling the distance protection system from the determined fault location or the re-determined fault location.

According to an embodiment, the first impedance boundary is indicative of a first physical distance protected by the distance protection system. According to an embodiment, the first impedance boundary is indicative of a first physical distance being a distance between the first position and a second position along the transmission line.

According to an embodiment, the method further comprises re-determining the fault location from the computed first impedance and a second impedance boundary, wherein the second impedance boundary is computed from at least one of the measurements obtained before a fault at the fault location occurs, at least one impedance of an equivalent model of a two-port equivalent across the transmission line, or a line impedance of the transmission line.

According to an embodiment, the method further comprises re-determining the fault location from the computed first impedance and a second impedance boundary, wherein the second impedance boundary is computed from the measurements obtained before a fault at the fault location occurs and/or at least one impedance.

According to an embodiment, the second impedance boundary is indicative of an apparent distance protected by the distance protection system. According to an embodiment, the apparent distance is a distance between the first position and an apparent position along the transmission line in the presence of a resistive fault on the transmission line. According to an embodiment, the apparent position is the farthest possible position, in particular of a resistive fault on the transmission line, as perceived by the distance protection based on the computed first impedance or the calculation of eq.(1).

According to an embodiment, the computing the second impedance comprises: determining a homogeneity of the electrical power system, from at least one impedance; and approximating, when the electrical power system is determined to be homogeneous, the second impedance from the at least one impedance; or estimating, when the electrical power system is determined to be non-homogeneous, the fault location from the received measurements and the at least one impedance; and computing the second impedance from the estimated fault location.

According to an embodiment, the computing the second impedance comprises: determining a homogeneity of the electrical power system, from at least one impedance of an equivalent model of a two-port equivalent across the transmission line and a line impedance of the transmission line; and approximating, when the electrical power system is determined to be homogeneous, the second impedance from the at least one impedance of the equivalent model of the two-port equivalent across the transmission line and the line impedance of the transmission line; or estimating, when the electrical power system is determined to be non-homogeneous, the fault location from the measurements received at the first position, the at least one impedance of the equivalent model of the two-port equivalent across the transmission line, and the line impedance of the transmission line; and computing the second impedance from the estimated fault location.

According to an embodiment, the computing the second impedance comprises: determining a homogeneity of the electrical power system, from at least one of at least one impedance of an equivalent model of a two-port equivalent across the transmission line or a line impedance of the transmission line; and approximating, when the electrical power system is determined to be homogeneous, the second impedance from at least one of the at least one impedance of the equivalent model of the two-port equivalent across the transmission line or the line impedance of the transmission line; or estimating, when the electrical power system is determined to be non-homogeneous, the fault location from at least one of the measurements received at the first position, the at least one impedance of the equivalent model of the two-port equivalent across the transmission line, or the line impedance of the transmission line; and computing the second impedance from the estimated fault location.

According to an embodiment, the approximating the second impedance is based on a homogeneity-based approximation of the phase angle of a third impedance. According to an embodiment, the third impedance is a deviation of the first impedance from impedance of the faulted segment of the line due to fault resistance. According to an embodiment, the impedance of the faulted segment of the line is a proportion of the line impedance falling in between the first position and the position of the fault on the transmission line.

According to an embodiment, the at least one impedance is or comprises: a line impedance of the transmission line; or at least one impedance of an equivalent model of a two-port equivalent across the transmission line.

According to an embodiment, the at least one impedance is updated from the measurements obtained before a fault at the fault location occurs.

According to an embodiment, the equivalent model of the two-port equivalent across the transmission line is estimated and/or updated from the measurements obtained before a fault at the fault location occurs.

According to an embodiment, a fault at the fault location is a resistive fault.

According to an embodiment, the first impedance boundary is indicative of a first physical distance being a distance between the first position and a second position along the transmission line.

According to an embodiment, the method further comprises determining, when the computed first impedance is inside of the first impedance boundary, the fault location is inside of the first physical distance.

According to an embodiment, the determining the fault location from the computed first impedance and the first impedance boundary comprises determining whether the computed first impedance is inside of the first impedance boundary.

According to an embodiment, the re-determining the fault location from the computed first impedance and the second impedance boundary comprises determining whether the computed first impedance is inside of the second impedance boundary.

According to an embodiment, the method further comprises determining, when the computed first impedance is outside of the second impedance boundary, the fault location is outside of the first physical distance.

According to an embodiment, the re-determining the fault location from the computed second impedance and the first impedance boundary comprises determining whether the computed second impedance is inside of the first impedance boundary.

According to an embodiment, the method further comprises determining, when the computed second impedance is inside of the first impedance boundary, the fault location is inside of the first physical distance.

The present disclosure also relates to a method for controlling a distance protection system comprising a distance protection device located at a first position along a transmission line for an electrical power system, the method comprising: receiving, by the distance protection device, measurements comprising current and/or voltage measurements; computing, by the distance protection device or the electrical power system, a first impedance from the received measurements; determining, by the distance protection device or the electrical power system, a fault location from the computed first impedance and a first impedance boundary; computing, by the distance protection device or the electrical power system, responsive to the determined fault location, a second impedance; re-determining, by the distance protection device or the electrical power system, the fault location from the computed second impedance and the first impedance boundary; and controlling the distance protection system from the determined fault location or the re-determined fault location.

According to an embodiment, the first impedance boundary is indicative of a first physical distance protected by the distance protection system. According to an embodiment, the first impedance boundary is indicative of a first physical distance being a distance between the first position and a second position along the transmission line.

According to an embodiment, the method further comprises re-determining, by the distance protection device or the electrical power system, the fault location from the computed first impedance and a second impedance boundary, wherein the second impedance boundary is computed, by the distance protection device or the electrical power system, from the measurements obtained before a fault at the fault location occurs and/or at least one impedance.

According to an embodiment, the method further comprises re-determining, by the distance protection device or the electrical power system, the fault location from the computed first impedance and a second impedance boundary, wherein the second impedance boundary is computed, by the distance protection device or the electrical power system, from at least one of the measurements obtained before a fault at the fault location occurs, at least one impedance of an equivalent model of a two-port equivalent across the transmission line, or a line impedance of the transmission line.

According to an embodiment, the second impedance boundary is indicative of an apparent distance protected by the distance protection system. According to an embodiment, the apparent distance is a distance between the first position and an apparent position along the transmission line in the presence of a resistive fault on the transmission line. According to an embodiment, the apparent position is the farthest possible position, in particular of a resistive fault on the transmission line, as perceived by the distance protection based on the computed first impedance or the calculation of eq.(1).

According to an embodiment, the computing the second impedance comprises: determining, by the distance protection device or the electrical power system, a homogeneity of the electrical power system, from at least one impedance; and approximating, by the distance protection device or the electrical power system, when the electrical power system is determined to be homogeneous, the second impedance from the at least one impedance; or estimating, by the distance protection device or the electrical power system, when the electrical power system is determined to be non-homogeneous, the fault location from the received measurements and the at least one impedance; and computing, by the distance protection device or the electrical power system, the second impedance from the estimated fault location.

According to an embodiment, the computing the second impedance comprises: determining, by the distance protection device or the electrical power system, a homogeneity of the electrical power system, from at least one impedance of an equivalent model of a two-port equivalent across the transmission line and a line impedance of the transmission line; and approximating, by the distance protection device or the electrical power system, when the electrical power system is determined to be homogeneous, the second impedance from the at least one impedance of the equivalent model of the two-port equivalent across the transmission line and the line impedance of the transmission line; or estimating, by the distance protection device or the electrical power system, when the electrical power system is determined to be non-homogeneous, the fault location from the measurements received at the first position, the at least one impedance of the equivalent model of the two-port equivalent across the transmission line, and the line impedance of the transmission line; and computing, by the distance protection device or the electrical power system, the second impedance from the estimated fault location.

According to an embodiment, the computing the second impedance comprises: determining, by the distance protection device or the electrical power system, a homogeneity of the electrical power system, from at least one of at least one impedance of an equivalent model of a two-port equivalent across the transmission line or a line impedance of the transmission line; and approximating, by the distance protection device or the electrical power system, when the electrical power system is determined to be homogeneous, the second impedance from at least one of the at least one impedance of the equivalent model of the two-port equivalent across the transmission line or the line impedance of the transmission line; or estimating, by the distance protection device or the electrical power system, when the electrical power system is determined to be non-homogeneous, the fault location from at least one of the measurements received at the first position, the at least one impedance of the equivalent model of the two-port equivalent across the transmission line, or the line impedance of the transmission line; and computing, by the distance protection device or the electrical power system, the second impedance from the estimated fault location.

According to an embodiment, the approximating the second impedance is based on a homogeneity-based approximation of the phase angle of a third impedance. According to an embodiment, the third impedance is a deviation of the first impedance from impedance of the faulted segment of the line due to fault resistance. According to an embodiment, the impedance of the faulted segment of the line is a proportion of the line impedance falling in between the first position and the position of the fault on the transmission line.

According to an embodiment, the at least one impedance is or comprises: a line impedance of the transmission line; or at least one impedance of an equivalent model of a two-port equivalent across the transmission line.

According to an embodiment, the at least one impedance is updated, by the distance protection or the electrical power system, from the measurements obtained before a fault at the fault location occurs.

According to an embodiment, the equivalent model of the two-port equivalent across the transmission line is estimated and/or updated, by the distance protection or the electrical power system, from the measurements obtained before a fault at the fault location occurs.

According to an embodiment, a fault at the fault location is a resistive fault.

According to an embodiment, the first physical distance is a distance between the first position and a second position along the transmission line.

According to an embodiment, the determining the fault location from the computed first impedance and the first impedance boundary comprises: determining, by the distance protection device or the electrical power system, whether the computed first impedance is inside of the first impedance boundary.

According to an embodiment, the method further comprises determining, by the distance protection device or the electrical power system, when the computed first impedance is inside of the first impedance boundary, the fault location is inside of the first physical distance.

According to an embodiment, the re-determining the fault location from the computed first impedance and the second impedance boundary comprises: determining, by the distance protection device or the electrical power system, whether the computed first impedance is inside of the second impedance boundary.

According to an embodiment, the method further comprises determining, by the distance protection device or the electrical power system, when the computed first impedance is outside of the second impedance boundary, the fault location is outside of the first physical distance.

According to an embodiment, the re-determining the fault location from the computed second impedance and the first impedance boundary comprises: determining, by the distance protection device or the electrical power system, whether the computed second impedance is inside of the first impedance boundary.

According to an embodiment, the method further comprises determining, by the distance protection device or the electrical power system, when the computed second impedance is inside of the first impedance boundary, the fault location is inside of the first physical distance.

The present disclosure also relates to a device for controlling a distance protection system comprising a distance protection device located at a first position along a transmission line for an electrical power system, the device comprising a processor being configured to: receive, e.g. via the distance protection device, measurements comprising current and/or voltage measurements; compute a first impedance from the received measurements; determine a fault location from the computed first impedance and a first impedance boundary; compute responsive to the determined fault location, a second impedance; re-determine, the fault location from the computed second impedance and the first impedance boundary; and control the distance protection system from the determined fault location or the re-determined fault location.

According to an embodiment, the first impedance boundary is indicative of a first physical distance protected by the distance protection system. According to an embodiment, the first impedance boundary is indicative of a first physical distance being a distance between the first position and a second position along the transmission line.

According to an embodiment, the processor is further configured to re-determine the fault location from the computed first impedance and a second impedance boundary, wherein the second impedance boundary is computed, from at least one of the measurements obtained before a fault at the fault location occurs, at least one impedance of an equivalent model of a two-port equivalent across the transmission line, or a line impedance of the transmission line According to an embodiment, the processor is further configured to re-determine the fault location from the computed first impedance and a second impedance boundary, wherein the second impedance boundary is computed, from the measurements obtained before a fault at the fault location occurs and/or at least one impedance.

According to an embodiment, the second impedance boundary is indicative of an apparent distance protected by the distance protection system. According to an embodiment, the apparent distance is a distance between the first position and an apparent position along the transmission line in the presence of a resistive fault on the transmission line. According to an embodiment, the apparent position is the farthest possible position, in particular of a resistive fault on the transmission line, as perceived by the distance protection based on the computed first impedance or the calculation of eq.(1).

According to an embodiment, the computing the second impedance comprises: determining a homogeneity of the electrical power system, from at least one impedance; and approximating, when the electrical power system is determined to be homogeneous, the second impedance from the at least one impedance; or estimating, when the electrical power system is determined to be non-homogeneous, the fault location from the received measurements and the at least one impedance; and computing the second impedance from the estimated fault location.

According to an embodiment, the computing the second impedance comprises: determining a homogeneity of the electrical power system, from at least one impedance of an equivalent model of a two-port equivalent across the transmission line and a line impedance of the transmission line; and approximating, when the electrical power system is determined to be homogeneous, the second impedance from the at least one impedance of the equivalent model of the two-port equivalent across the transmission line and the line impedance of the transmission line; or estimating, when the electrical power system is determined to be non-homogeneous, the fault location from the measurements received at the first position, the at least one impedance of the equivalent model of the two-port equivalent across the transmission line, and the line impedance of the transmission line; and computing the second impedance from the estimated fault location.

According to an embodiment, the computing the second impedance comprises: determining a homogeneity of the electrical power system, from at least one of at least one impedance of an equivalent model of a two-port equivalent across the transmission line or a line impedance of the transmission line; and approximating, when the electrical power system is determined to be homogeneous, the second impedance from at least one of the at least one impedance of the equivalent model of the two-port equivalent across the transmission line or the line impedance of the transmission line; or estimating, when the electrical power system is determined to be non-homogeneous, the fault location from at least one of the measurements received at the first position, the at least one impedance of the equivalent model of the two-port equivalent across the transmission line, or the line impedance of the transmission line; and computing the second impedance from the estimated fault location.

According to an embodiment, the approximating the second impedance is based on a homogeneity-based approximation of the phase angle of a third impedance. According to an embodiment, the third impedance is a deviation of the first impedance from impedance of the faulted segment of the line due to fault resistance. According to an embodiment, the impedance of the faulted segment of the line is a proportion of the line impedance falling in between the first position and the position of the fault on the transmission line.

According to an embodiment, the at least one impedance is or comprises: a line impedance of the transmission line; or at least one impedance of an equivalent model of a two-port equivalent across the transmission line.

According to an embodiment, the at least one impedance is updated, by the distance protection or the electrical power system, from the measurements obtained before a fault at the fault location occurs.

According to an embodiment, the equivalent model of the two-port equivalent across the transmission line is estimated and/or updated, by the distance protection or the electrical power system, from the measurements obtained before a fault at the fault location occurs.

According to an embodiment, a fault at the fault location is a resistive fault.

According to an embodiment, the first physical distance is a distance between the first position and a second position along the transmission line.

According to an embodiment, the determining the fault location from the computed first impedance and the first impedance boundary comprises: determining, whether the computed first impedance is inside of the first impedance boundary.

According to an embodiment, the processor is further configured to: determine when the computed first impedance is inside of the first impedance boundary, the fault location is inside of the first physical distance.

According to an embodiment, the re-determining the fault location from the computed first impedance and the second impedance boundary comprises: determining whether the computed first impedance is inside of the second impedance boundary.

According to an embodiment, the processor is further configured to: determine when the computed first impedance is outside of the second impedance boundary, the fault location is outside of the first physical distance.

According to an embodiment, the re-determining the fault location from the computed second impedance and the first impedance boundary comprises: determining whether the computed second impedance is inside of the first impedance boundary.

According to an embodiment, the processor is further configured to: determine when the computed second impedance is inside of the first impedance boundary, the fault location is inside of the first physical distance.

The present disclosure further relates to an electrical power system comprising a comprising at least one of the aforementioned devices.

Among others, the presented methods, devices and systems improve the distance relay performance in terms of its dependability. Moreover, this improvement in dependability is achieved while safeguarding the relay security. The presented methods, devices and systems do not rely only on a modification of the relay characteristic. With the present disclosure it is possible to establish a two-level check with respect to the base zone characteristic to ascertain fault in its zone. In addition, for the present disclosure, network homogeneity is neither required nor assumed. The presented methods, devices and systems do not preclude transmission lines connected with converter interfaced renewable power plants.

Various exemplary embodiments of the present disclosure disclosed herein are directed to providing features that will become readily apparent by reference to the following description when taken in conjunction with the accompanying drawings. In accordance with various embodiments, exemplary systems, methods, and devices are disclosed herein. It is understood, however, that these embodiments are presented by way of example and not limitation, and it will be apparent to those of ordinary skill in the art who read the present disclosure that various modifications to the disclosed embodiments can be made while remaining within the scope of the present disclosure.

Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

The above and other aspects and their implementations are described in greater detail in the drawings, the descriptions, and the claims.

BRIEF DESCRIPTION OF THE DRAWINGS

FIG. 8 illustrates exemplary two-port equivalent parameters of the two-port equivalent model across a transmission line.

DETAILED DESCRIPTION OF THE DISCLOSURE

Figure 5:
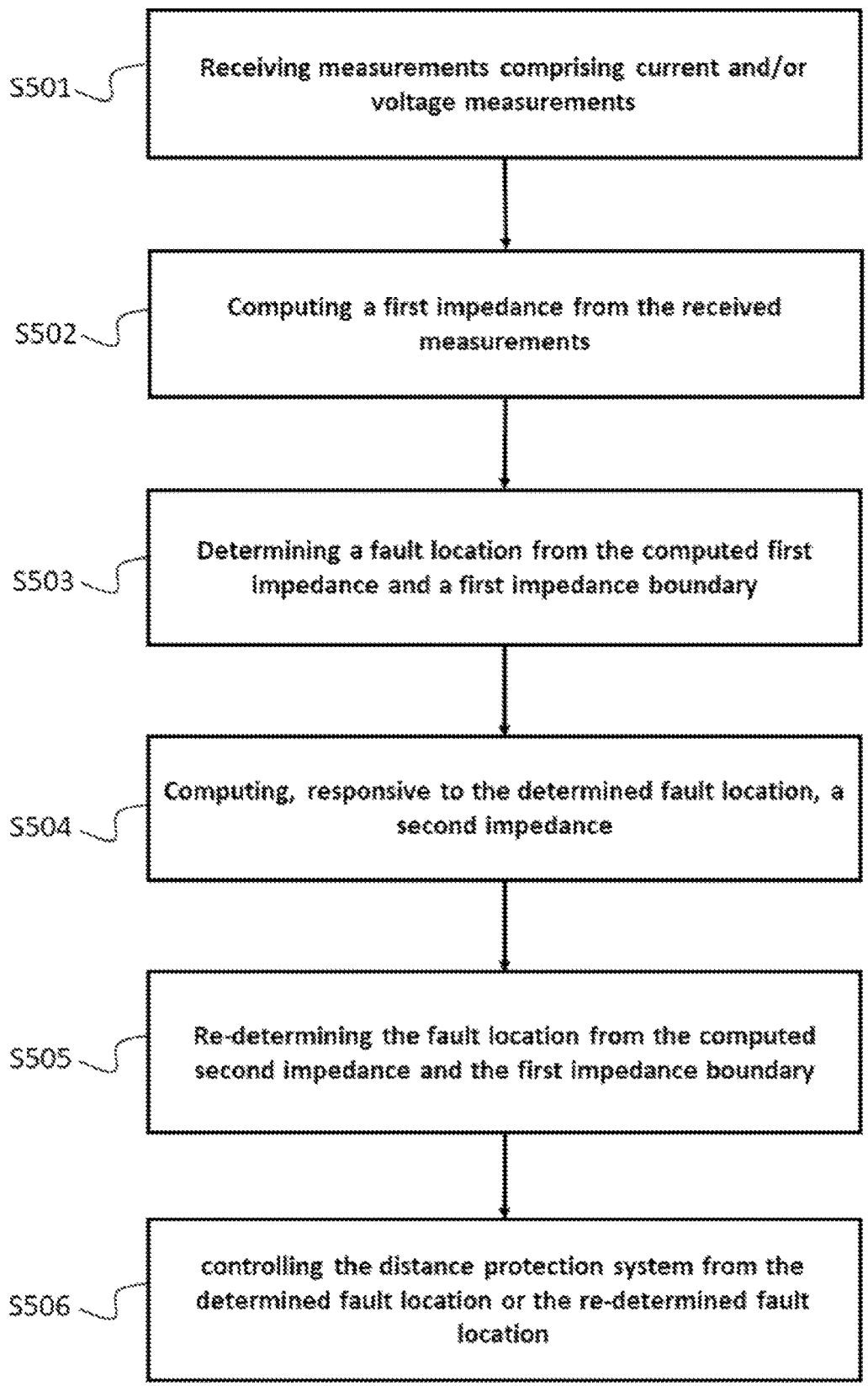
FIG. 5 illustrates a flow chart of the method according to an embodiment of the present disclosure.

FIG. 5 illustrates a flow chart of the method according to an embodiment of the present disclosure. The method particularly applies to controlling a distance protection system comprising a distance protection device located at a first position along a transmission line for an electrical power system. A first block S501 performs the receiving, e.g. by a distance protection device, measurements comprising current and/or voltage measurements. It is understood by the skilled person in the art that the wording 'receiving' may comprise or bear the same meaning as, thusly be interchangeably used with, the wording 'obtaining', 'measuring', 'sensing', or the like. A second block S502 performs, e.g. by the distance protection device or the electrical power system, the computing a first impedance from the received measurements. It is understood by the skilled person in the art that the wording 'computing' may comprise or bear the same meaning as, thusly be interchangeably used with, the wording 'determining' or the like. A third block S503 performs, e.g. by the distance protection device or the electrical power system, the determining a fault location from the computed first impedance and a first impedance boundary. A fourth block S504 performs the computing, e.g. by the distance protection device or the electrical power system, responsive to the determined fault location, a second impedance. A fifth block S505 performs the re-determining, e.g. by the distance protection device or the electrical power system, the fault location from the computed second impedance and the first impedance boundary. A sixth block S506 performs the controlling the distance protection system from the determined fault location or the re-determined fault location. This may be done, e.g., by the distance protection device or the electrical power system. It is understood by the skilled person that the wording 'from' may comprise or bear the same meaning as, thusly be interchangeably used with, the wording 'based on', 'using', or the like.

According to an embodiment, the first impedance boundary is indicative of a first physical distance protected by the distance protection system.

According to an embodiment, the method further comprises re-determining, e.g. by the distance protection device or the electrical power system, the fault location from the computed first impedance and a second impedance boundary, wherein the second impedance boundary is computed, e.g. by the distance protection device or the electrical power system, from the measurements obtained before a fault at the fault location occurs and/or at least one impedance of an equivalent model of a two-port equivalent across the transmission line.

According to an embodiment, the method further comprises re-determining, e.g. by the distance protection device or the electrical power system, the fault location from the computed first impedance and a second impedance boundary, wherein the second impedance boundary is computed, e.g. by the distance protection device or the electrical power system, from at least one of the measurements obtained before a fault at the fault location occurs, at least one impedance of an equivalent model of a two-port equivalent across the transmission line, or a line impedance of the transmission line.

According to an embodiment, the second impedance boundary is indicative of an apparent distance protected by the distance protection system. According to an embodiment, the apparent distance is a distance between the first position and an apparent position along the transmission line in the presence of a resistive fault on the transmission line. According to an embodiment, the apparent position is the farthest possible position, in particular of a resistive fault on the transmission line, as perceived by the distance protection based on the computed first impedance or the calculation of eq.(1).

According to an embodiment, the computing the second impedance comprises: determining, e.g. by the distance protection device or the electrical power system, a homogeneity of the electrical power system, from at least one impedance; and approximating, e.g. by the distance protection device or the electrical power system, when the electrical power system is determined to be homogeneous, the second impedance from the at least one impedance; or estimating, e.g. by the distance protection device or the electrical power system, when the electrical power system is determined to be non-homogeneous, the fault location from the received measurements and the at least one impedance; and computing, e.g. by the distance protection device or the electrical power system, the second impedance from the estimated fault location.

According to an embodiment, the computing the second impedance comprises: determining, e.g. by the distance protection device or the electrical power system, a homogeneity of the electrical power system, from at least one impedance of an equivalent model of a two-port equivalent across the transmission line and a line impedance of the transmission line; and approximating, e.g. by the distance protection device or the electrical power system, when the electrical power system is determined to be homogeneous, the second impedance from the at least one impedance of the equivalent model of the two-port equivalent across the transmission line and the line impedance of the transmission line; or estimating, e.g. by the distance protection device or the electrical power system, when the electrical power system is determined to be non-homogeneous, the fault location from the measurements received at the first position, the at least one impedance of the equivalent model of the two-port equivalent across the transmission line, and the line impedance of the transmission line and the at least one impedance; and computing, e.g. by the distance protection device or the electrical power system, the second impedance from the estimated fault location.

According to an embodiment, the computing the second impedance comprises: determining, e.g. by the distance protection device or the electrical power system, a homogeneity of the electrical power system, from at least one of at least one impedance of an equivalent model of a two-port equivalent across the transmission line or a line impedance of the transmission line; and approximating, e.g. by the distance protection device or the electrical power system, when the electrical power system is determined to be homogeneous, the second impedance from at least one of the at least one impedance of the equivalent model of the two-port equivalent across the transmission line or the line impedance of the transmission line; or estimating, e.g. by the distance protection device or the electrical power system, when the electrical power system is determined to be non-homogeneous, the fault location from at least one of the measurements received at the first position, the at least one impedance of the equivalent model of the two-port equivalent across the transmission line, or the line impedance of the transmission line and the at least one impedance; and computing, e.g. by the distance protection device or the electrical power system, the second impedance from the estimated fault location.

According to an embodiment, the approximating the second impedance is based on a homogeneity-based approximation of the phase angle of a third impedance. According to an embodiment, the third impedance is a deviation of the first impedance from impedance of the faulted segment of the line due to fault resistance. According to an embodiment, the impedance of the faulted segment of the line is a proportion of the line impedance falling in between the first position and the position of the fault on the transmission line.

According to an embodiment, the at least one impedance is or comprises: a line impedance of the transmission line; or at least one impedance of an equivalent model of a two-port equivalent across the transmission line.

According to an embodiment, the at least one impedance is updated, e.g. by the distance protection or the electrical power system, from the measurements obtained before a fault at the fault location occurs.

According to an embodiment, the equivalent model of the two-port equivalent across the transmission line is estimated and/or updated, e.g. by the distance protection or the electrical power system, from the measurements obtained before a fault at the fault location occurs.

According to an embodiment, a fault at the fault location is a resistive fault.

According to an embodiment, the first physical distance is a distance between the first position and a second position along the transmission line.

According to an embodiment, the determining the fault location from the computed first impedance and the first impedance boundary comprises: determining, e.g. by the distance protection device or the electrical power system, whether the computed first impedance is inside of the first impedance boundary.

According to an embodiment, the method further comprises determining, e.g. by the distance protection device or the electrical power system, when the computed first impedance is inside of the first impedance boundary, the fault location is inside of the first physical distance.

According to an embodiment, the re-determining the fault location from the computed first impedance and the second impedance boundary comprises: determining, e.g. by the distance protection device or the electrical power system, whether the computed first impedance is inside of the second impedance boundary.

According to an embodiment, the method further comprises determining, e.g. by the distance protection device or the electrical power system, when the computed first impedance is outside of the second impedance boundary, the fault location is outside of the first physical distance.

According to an embodiment, the re-determining the fault location from the computed second impedance and the first impedance boundary comprises: determining, e.g. by the distance protection device or the electrical power system, whether the computed second impedance is inside of the first impedance boundary.

According to an embodiment, the method further comprises determining, e.g. by the distance protection device or the electrical power system, when the computed second impedance is inside of the first impedance boundary, the fault location is inside of the first physical distance.

Figure 6A:
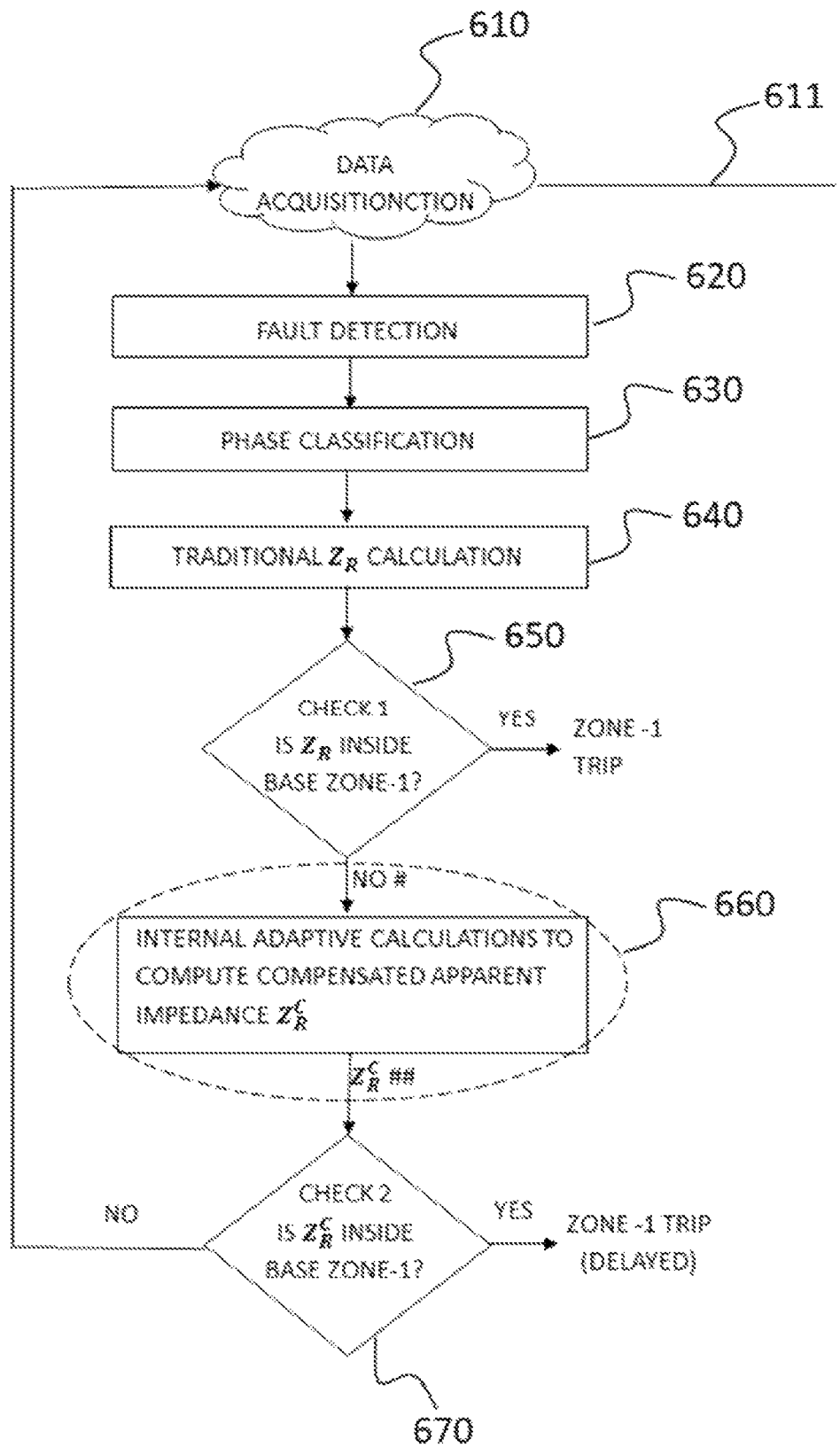
FIG. 6a) and FIG. 6b) illustrate a flow chart illustrating an overview of the method according to an embodiment of the present disclosure.
Figure 6B:
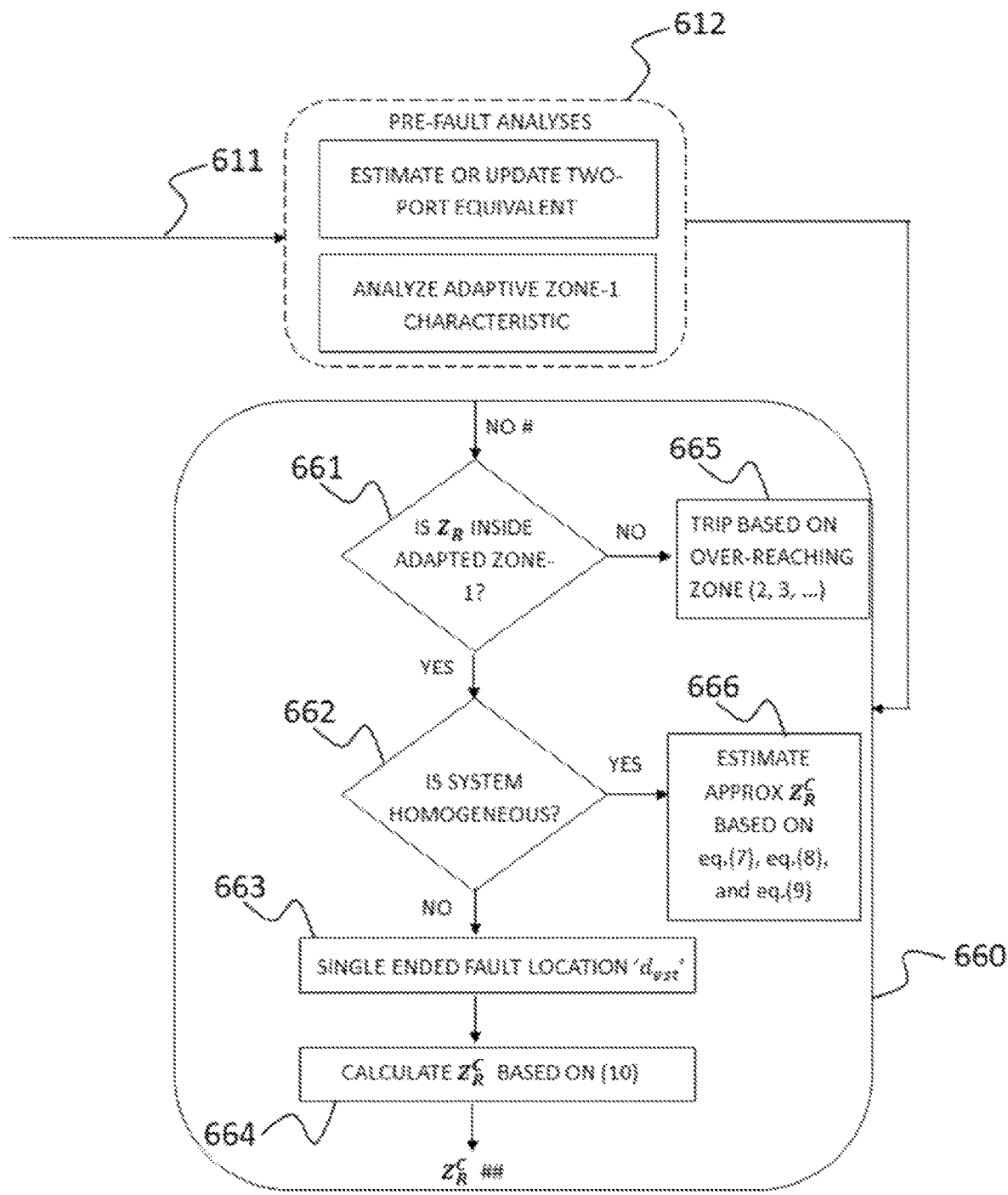

FIG. 6a) and FIG. 6b) illustrate a flow chart illustrating an overview of the method according to an embodiment of the present disclosure. The method embodiment of FIG. 6 acquires data 610, in particular by performing the first block S501, detects a fault 620 based on the acquired data, classifies phases 630 based on the detected fault, and computes the apparent impedance $Z_R$, in particular according to eq.(1). Said apparent impedance $Z_R$ is compared to the first base boundary 151, as shown in 650. According to an embodiment, the comparing comprises checking if said apparent impedance $Z_R$ is within the first base boundary 151. According to an embodiment, the distance protection system and/or the distance relay 111 included therein performs said comparison of 650. In addition, the acquired data in 610 is received 611 by a pre-fault analyses block 612 performing analysis of data obtained prior to a fault. The analysis includes a two-port equivalent estimation or update, as well as a modification of the first base boundary 151. The modified first base boundary is hereinafter referred to as an adapted first base boundary 301. According to an embodiment, the adapted first base boundary 301 is the second impedance boundary. The output of the pre-fault analyses block 612 are fed to the internal adaptive calculation block 660.

If $Z_R$ is found to be lying within first base boundary 151, then the distance protection system and/or the at least one distance relay included therein generates an instantaneous trip signal as the fault is detected in Zone-1 131. If $Z_R$ is not within the first base boundary 151 then, an internal adaptive calculation block 660 is performed. The internal adaptive calculation block 660 comprises: a first decision block 661 for checking whether $Z_R$ is inside the adapted first base boundary 301; a second decision block 662 for determining whether the system is homogeneous; a third block 663 for estimating the fault location 'd' based on single-ended measurements; and a fourth block 664 for calculating a modified apparent impedance $Z_R^c$.

The first decision block 661 checks whether $Z_R$ is inside the adapted first base boundary 301. If $Z_R$ is not inside the adapted first base boundary 301, the fault is determined to be not within the first Zone-1 131. Accordingly, trip determination and control are overtaken by the over-reaching zones (2, 3, . . . ), block 665. According to an embodiment, the first decision block 661 is performed by the distance protection system and/or the distance relay 111. According to an embodiment, the fault location is further re-determined by the distance protection system and/or a further distance relay different from the distance relay 111 corresponding to the overreaching zones (Zone-2, Zone-3, etc.). According to an embodiment, the distance protection system and/or the further distance relay is controlled based on the further re-determined fault location.

If $Z_R$ is inside the adapted zone-1 boundary, the homogeneity of the electrical power system, to which the distance protection is applied, is determined, in particular based on at least one impedance of the equivalent model 200 of a two-port equivalent across the transmission line 'L' 100. If the system is homogeneous, i.e., the source impedances $Z_{sM}$ 212 and $Z_{sN}$ 222 are found to have similar phase angles with respect to the line impedance (e.g. deviation of less than 10°), then the modified apparent impedance 4 is computed according to block 666. $Z_R^c$ is computed by first estimating the fault location (single-ended) fault location based on measurements obtained at the first position, the line impedance of the transmission line, and the at least one impedance of the equivalent model of the two-port equivalent across the transmission line. That is, $Z_R^c$ is computed as follows:

$$Z_R^c = Z_R - \Delta Z_R \tag{8}$$

Substituting $\Delta Z_R$ of eq.(3) into eq. (8), leads to the following expression of $Z_R^c$:

$$Z_R^c = \frac{|Z_R|\sin(\phi_R - \phi_\Delta)}{\sin(\phi_{1L} - \phi_\Delta)} e^{j\phi_{1L}}. \quad (9)$$

As the system is determined to be homogeneous, in particular by the second decision block 662, $\phi_\Delta$ of eq.(4) can be computed based on the approximate formula of eq.(7) to be used in eq. (9).

If the system is determined to be non-homogeneous, $Z_R^c$ is computed by performing the third block 663. According to an embodiment, said $Z_R^c$ computation method is based on the voltage and current measurements available at the relay 111 and at least one parameter of the two-port equivalent model 200. According to an embodiment, said $Z_R^c$ computation method is used for any fault type different from a phase-to-ground fault. Typically, said $Z_R^c$ computation method performs satisfactorily only after the fault transients have decayed, for which a delayed data window, example 1.5-2.5 cycles after fault detection can be used. According to an embodiment, said delay is necessary for obtaining a reasonably accurate estimate (~below 5%) of the fault location. The resulting estimate of the fault location '$d_{est}$' is related to the modified apparent impedance $Z_R^c$ as follows:

$$Z_R^c = (d_{est} + \varepsilon) Z_{1L} \quad (10)$$

wherein '$\varepsilon$' is a margin kept for maintaining security of the method against fault location estimation errors.

Ultimately, the internal adaptive calculation block 660 computes 4, in particular according to eq.(9) or eq.(10), which is compared against the first base boundary in block 670. If $Z_R^c$ is found to be lying within first base boundary 151, then the distance protection system and/or the at least one distance relay included therein generates an instantaneous trip signal as the fault is detected in Zone-1 131. If $Z_R$ is not within the first base boundary 151 then, the fault is determined to be not within the first Zone-1 131 and returns to the data acquisition 610.

Figure 1A:
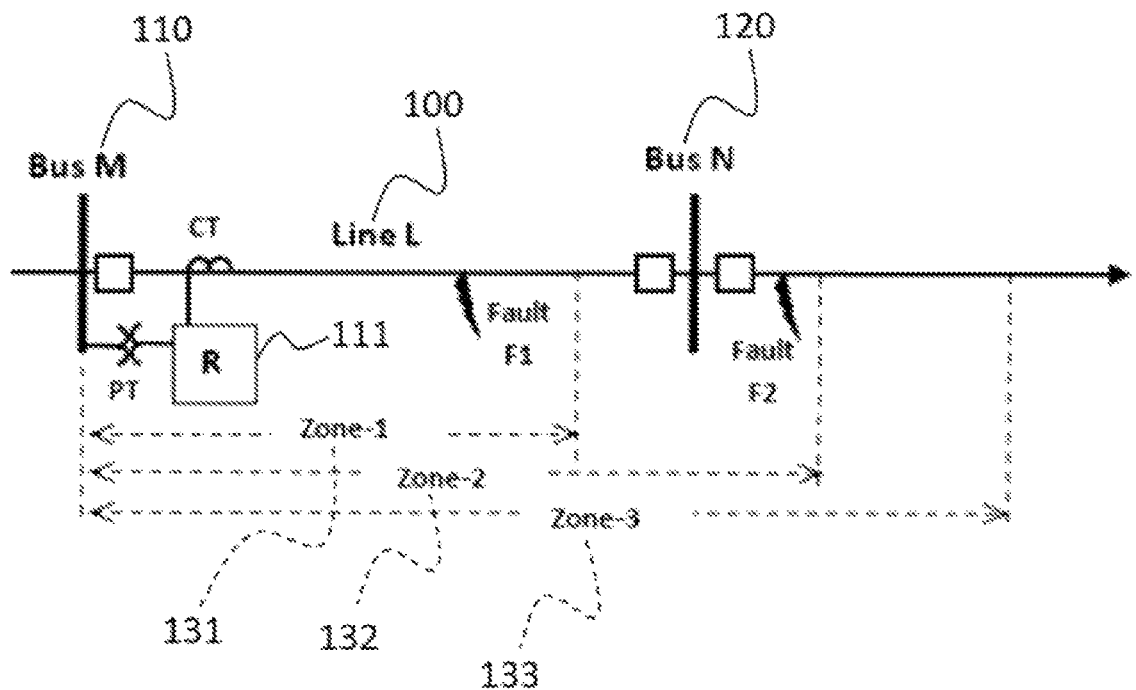
FIG. 1a) illustrates an overview of a distance protection and a protected transmission line.
Figure 1B:
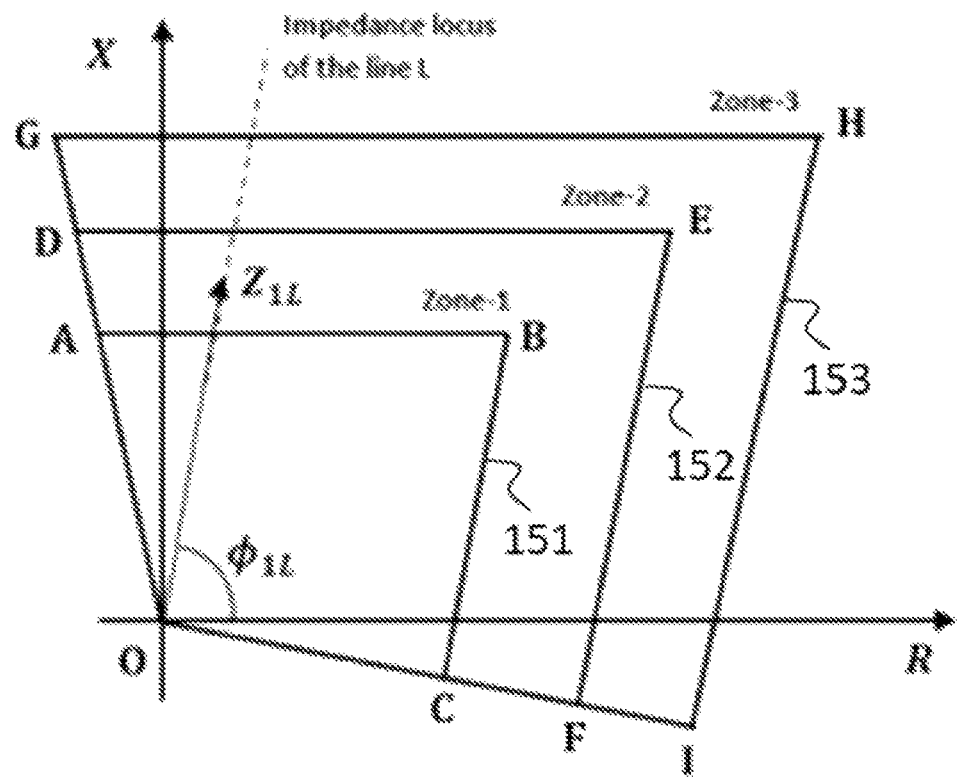
FIG. 1b) illustrates conventional operating characteristics of a distance protection.
Figure 2:
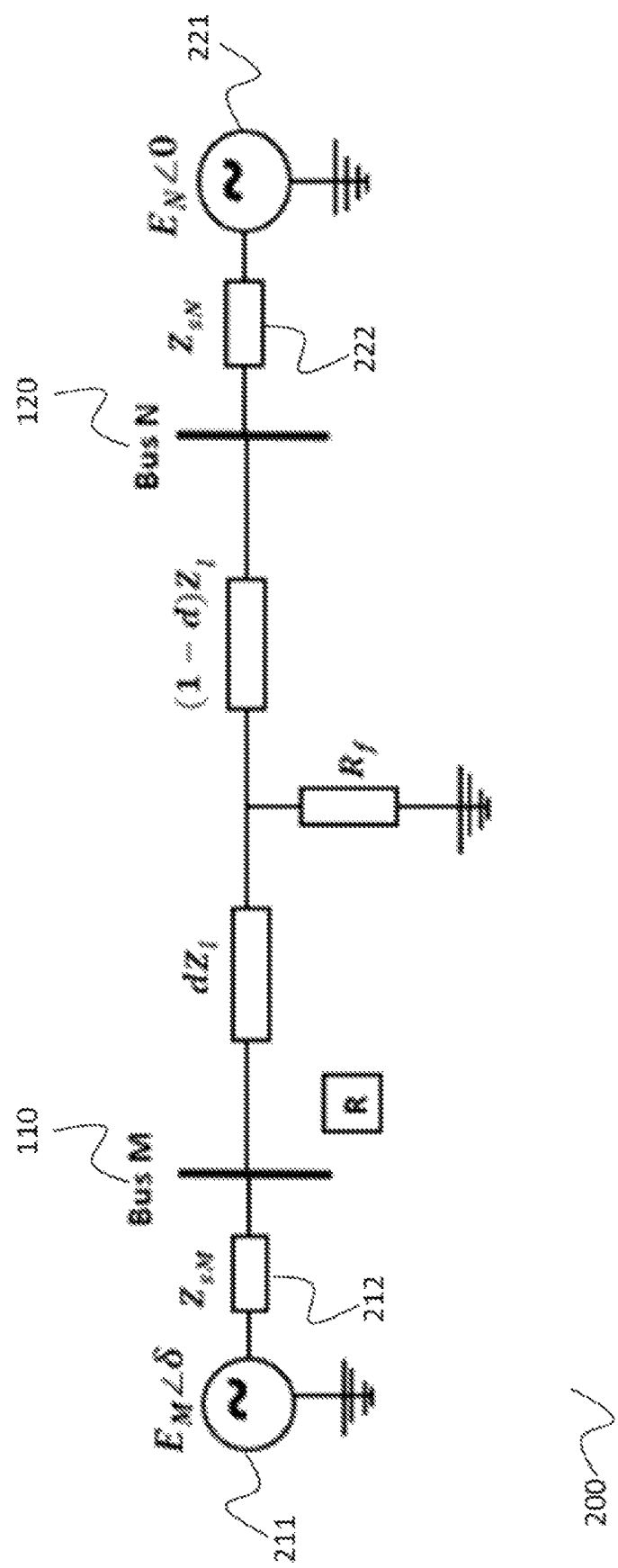
FIG. 2 illustrates a two-port equivalent model across a transmission line.
Figure 3:
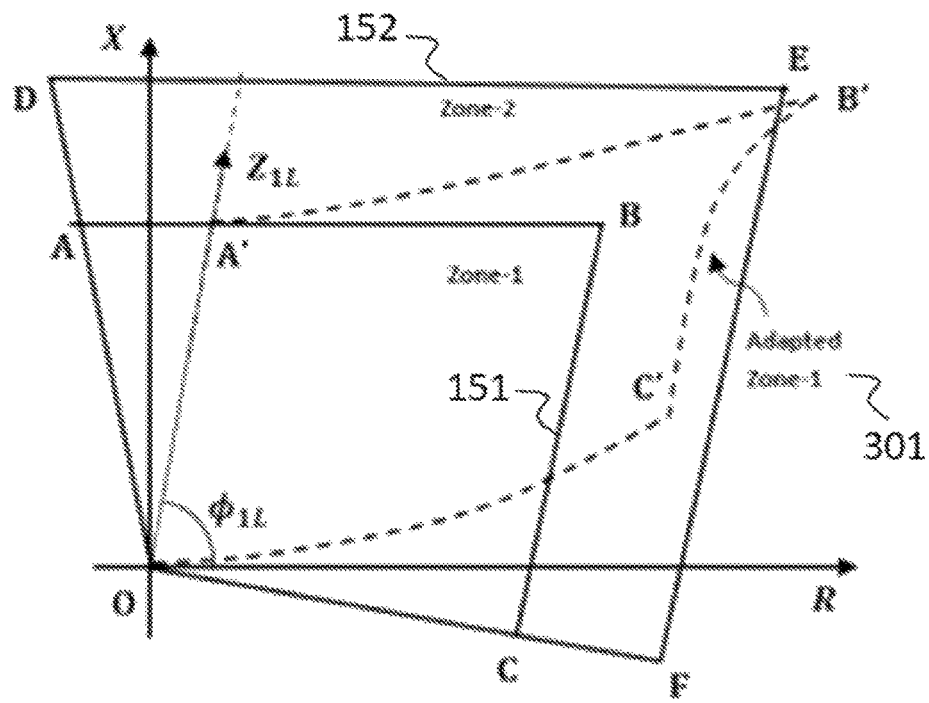
FIG. 3 illustrates an adapted operating characteristic of a distance protection.
Figure 4:
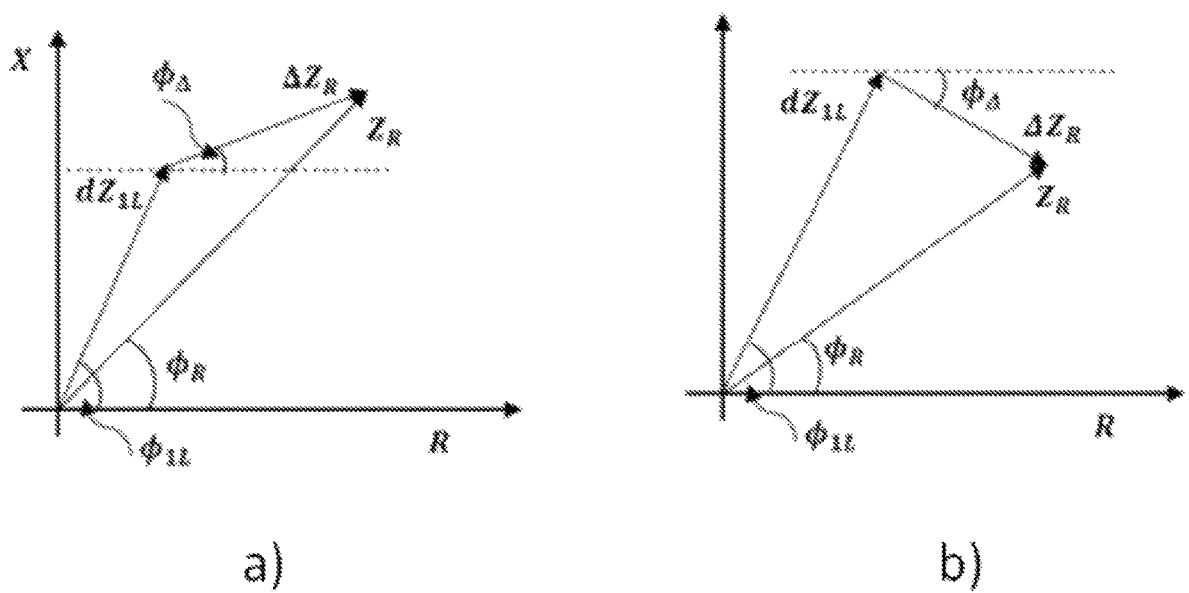
FIG. 4 illustrates an adapted apparent impedance calculation of a distance protection.

The method of FIG. 6 utilizes an adapted first base boundary 301 internally (the first decision block 661) to determine whether the apparent impedance $Z_R$ has truly escaped the first base boundary 151. This is because the adapted first base boundary 301 is a better means to adjudicate jurisdiction of the relay viz-a-viz a fault as it is more representative of the prevailing operating conditions of the system. While non-existence of $Z_R$ within the adapted first base boundary 301 gives a good assurance that the fault is beyond Zone-1 131, existence of $Z_R$ therein could be either due to the fault being in Zone-1 131 or due to the adapted first base boundary 301 overreaching the second base boundary 152 for the fault. The method of FIG. 6 therefore goes one step ahead to implement a check based on a compensated apparent impedance $Z_R^c$. In doing so, it is proposed that the available two-port equivalent model parameters be utilized to assess homogeneity of the system as this can avoid the time-delayed calculations of $Z_R^c$ based on the iterative '$d_{est}$' estimation and therefore Zone-1 131 can operate with a minimal time delay (which may be necessary for performing the first decision block 661), which is desirable. As described above, if the system is not homogeneous then the blocks 663 and 664 are performed, which ensure correct operation of Zone-1 131 although with a time delay of a few cycles. According to an embodiment, the faut location is computed by solving a quadratic equation to calculate 'd' and '$R_F$' without having any iterative/convergence issues. The method of FIG. 6 does not preclude application to transmission lines connected with converter interfaced renewable power plants provided that such a system can be represented by a two-port equivalent model 200 shown in FIG. 2 during line faults.

Figure 7:
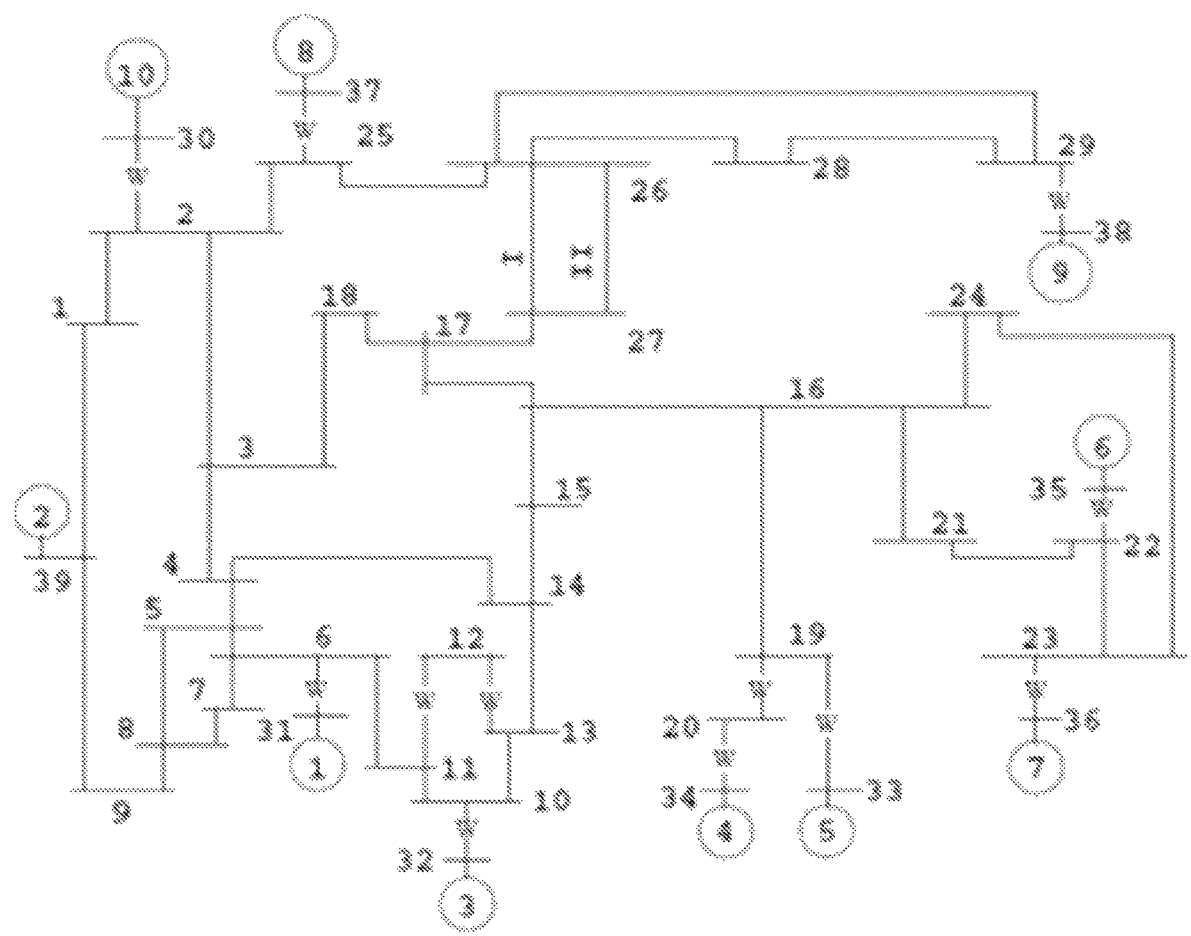
FIG. 7 illustrates an exemplary bus test system according to an embodiment of the present disclosure.

FIG. 7 illustrates an exemplary bus test system according to an embodiment of the present disclosure. In particular, the method of FIG. 6 for adaptive distance relaying is studied based on the IEEE 39 bus test system as shown in FIG. 7. The system is simulated in PSCAD.

For the purpose of this illustration, the transmission line between buses 26 and 27 is considered as a double circuit line, i.e., two identical lines running in parallel between the buses. Mutual coupling between the line is also modelled. Exemplary parameters of the line 26-27 are provided in FIG. 8.

The primary line of concern here is circuit-I of the double circuit line between buses 26-27. Bus 26 is considered as the relay station 'M' 110 for this case study. Bus 27 is the remote end bus 'N' 120. Line 25-26 is considered to be outaged (i.e., taken out of operation) in the pre-fault operating condition considered for the illustrations here. Two fault scenarios are considered on the line 26-27 (I) to demonstrate the proposed scheme. In scenario (1), an A-G fault is simulated on the line at a length of 70% from the relay bus 26, the fault resistance is 30Ω. In the scenario (2), the fault is simulated at 90% from the relay bus 26, the fault resistance is 20Ω. The fault of scenario (1) is in Zone-1 jurisdiction of the relay and the fault of scenario (2) is in Zone-2. Therefore, the relay should detect only the fault of scenario (1) in Zone-1. Scenario (1) and Scenario (2) are illustrated in FIG. 9 and FIG. 10, respectively.

Figure 9A:
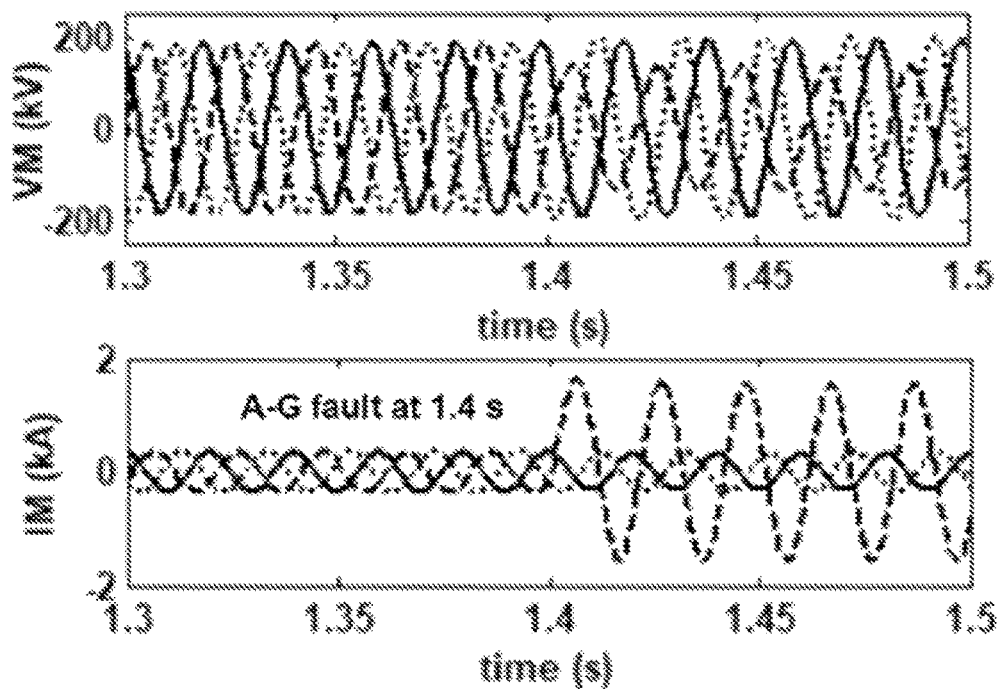
FIG. 9a) illustrates voltage and current measurements at a relay located along a transmission line according to an embodiment of the present disclosure.
Figure 9B:
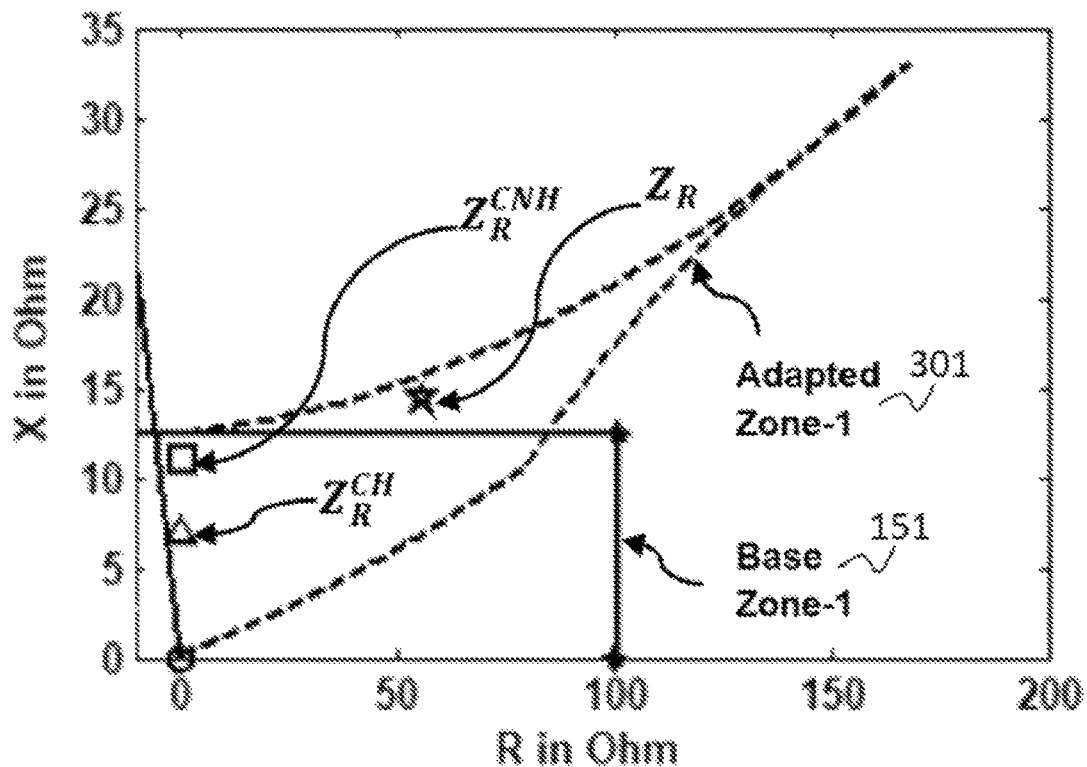
FIG. 9b) illustrates an operating characteristic of the distance protection according to an embodiment of the present disclosure.

FIG. 9a) illustrates voltage and current measurements at a relay located along a transmission line according to an embodiment of the present disclosure and FIG. 9b) illustrates an operating characteristic of the distance protection according to an embodiment of the present disclosure. In particular, FIG. 9a) illustrates the voltage and current waveforms seen at the relay terminal 'M' 110 when the fault occurs at 1.4 s and FIG. 9b) illustrates the position of the apparent impedance $Z_R$ with respect to the base Zone-1 151 (or equivalently the first base boundary 151). This fault which lies in Zone-1 131 of the relay is evading the base Zone-1 trip boundary 151 and falls within Zone-2 trip boundary 152.

The pre-fault two port equivalent parameters of the network across the line corridor 26-27 is shown in FIG. 8. These parameters along with the line impedance parameters are used to construct the adapted Zone-1 characteristic 301 (or equivalently the adapted first base boundary 301) which is also plotted in FIG. 9b). It is observed that, $Z_R$ is within the adapted Zone-1 and therefore the case merits further check.

The line impedance phase angle is approximately equal to 85°. Phase angles of the source impedances $Z_{sM}$ 212 and $Z_{sN}$ 222 at the bus 26 and bus 27 are approximately equal to 65° and 76° respectively. The phase angular differences between the line impedance and the source impedances $Z_{sM}$ 212 and $Z_{sN}$ 222 are not negligibly small. However, for the purpose of demonstration both approaches are discussed, i.e., by considering the system to be homogeneous and non-homogeneous respectively.

First, a homogeneous system is considered. The angle $\phi_\Delta$ is estimated by approximating arg($I_f$) to be equal to arg ($\Delta I_{Ma1}$) according to eq.(7). This approximation results in $\phi_\Delta \approx 7.6864°$. However, computing $\phi_\Delta$ from the simulated measurements yields $\phi_\Delta = 3.6320°$. The error introduced in $\phi_\Delta$ is due to the approximation. The approximate $\phi_A$ is then used in eq.(9) to calculate the compensated apparent impedance $Z_R^c$ which is found to be $0.6580+j6.9086\Omega$. This is also plotted in FIG. 9b) as the homogeneous-system compensated apparent impedance $Z_R^{CH}$. The faulted line impedance $dZ_{1L}$ for this case is $1.0368+j10.8868\Omega$. It is clear that $Z_R^{CH}$ is a poor approximation to the faulted line impedance, which may be owed to the homogeneity assumption.

Figure 9C:
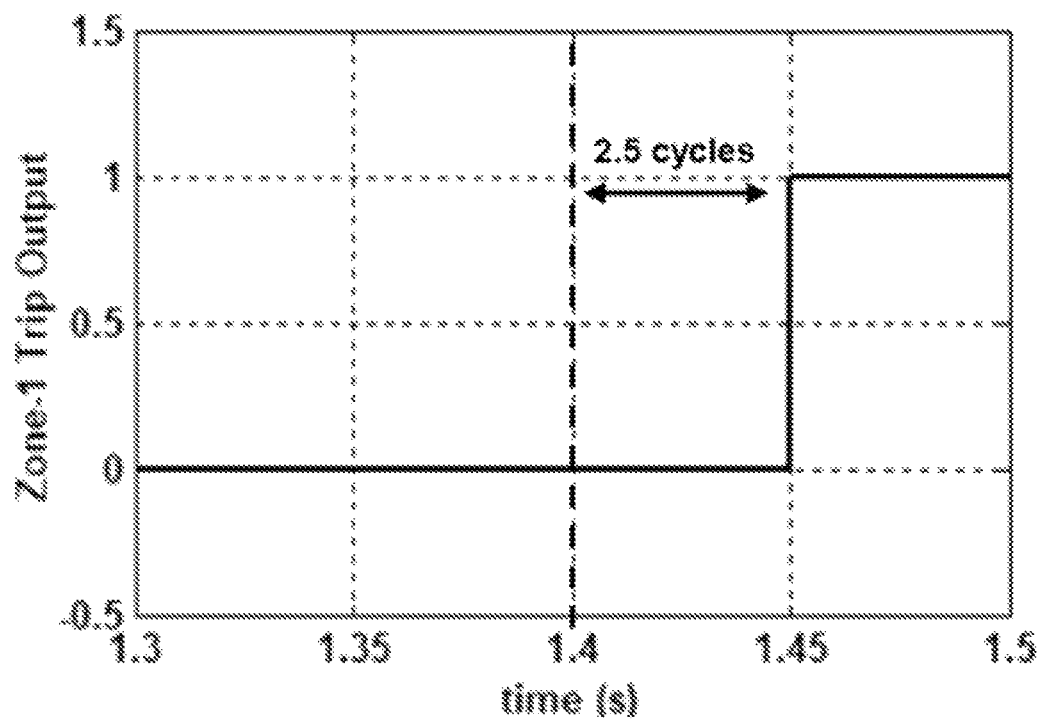
FIG. 9c) illustrates a trip output for a zone of a transmission line protected by the distance protection according to an embodiment of the present disclosure.
Figure 9D:
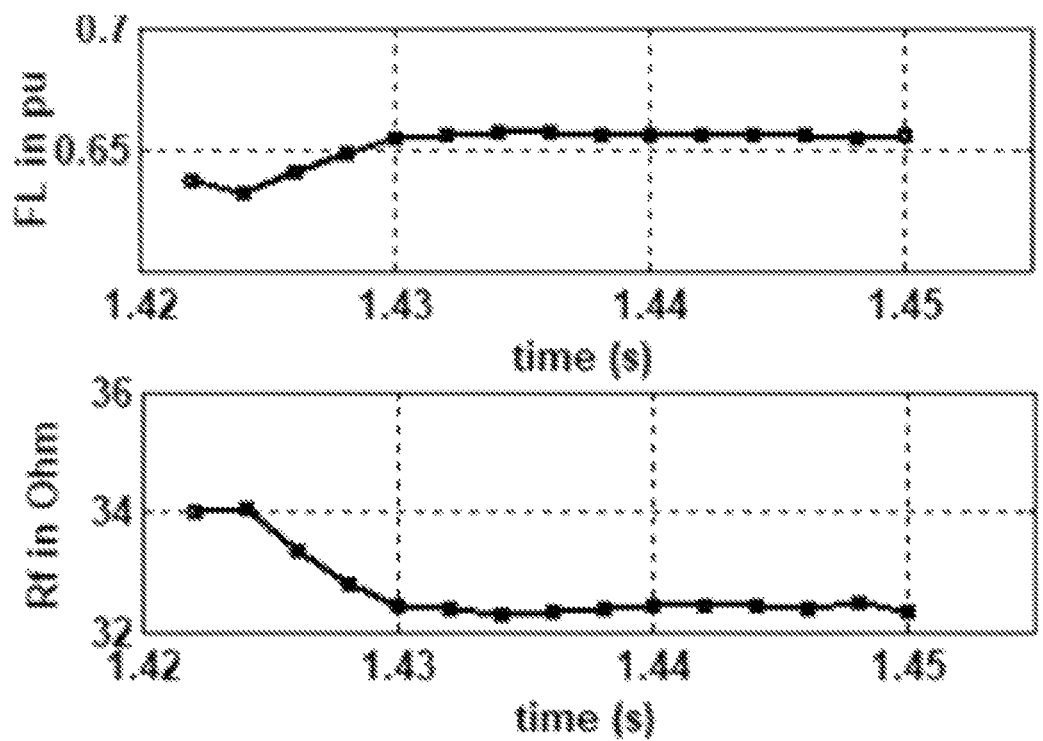
FIG. 9d) illustrates an output of a single-ended fault locator of the distance protection according to an embodiment of the present disclosure.

Alternatively, an non-homogeneous system is considered, which will invoke the fault location estimation, as in block 663, in order to calculate the compensated apparent impedance 4, according to block 664. The result of the fault location estimation module is shown in FIG. 9d), using which, $Z_R^c$ is found to be $1.0206+j10.7159\Omega$ based on eq.(10). This is plotted in FIG. 9b) as the inhomogeneous-system compensated apparent impedance $Z_R^{CNH}$. This value of $Z_R^{CNH}$ is indeed a good approximation to the faulted line impedance and therefore aids the relay in making a more reliable decision when $Z_R^{CNH}$ is compared against the base Zone-1 trip boundary 151. In this case the Zone-1 trip decision is delayed by 2.5 cycles, as shown in FIG. 9c), due to the fault location estimation (block 663). This is still better than cycles delayed clearing based on the further fault location determining within the Zone-2 132. It can be argued here that the value of $Z_R^c$ found by assuming homogeneity also lies within the base Zone-1 boundary 151 and would therefore also lead to a correct trip decision. However, in general, allowing the relay to take a trip decision based on poor approximates of the faulted line impedance can cause maloperations. This aspect will be made clear in Scenario (2), as illustrated in FIG. 10.

Figure 10A:
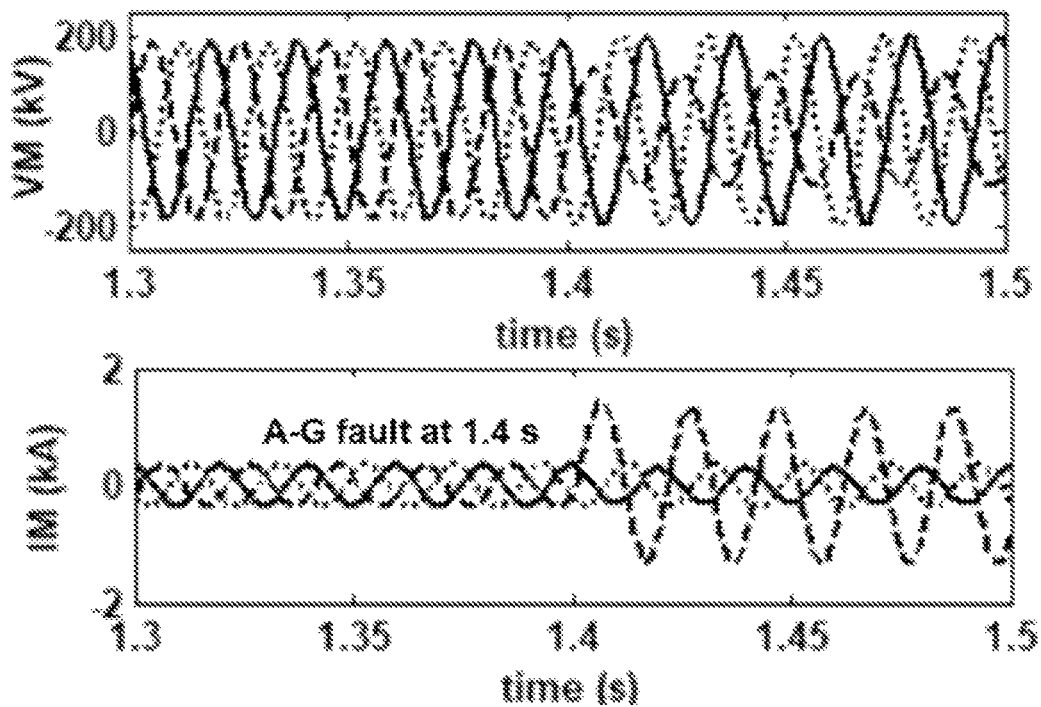
FIG. 10a) illustrates voltage and current measurements at a relay located along a transmission line according to an embodiment of the present disclosure.
Figure 10B:
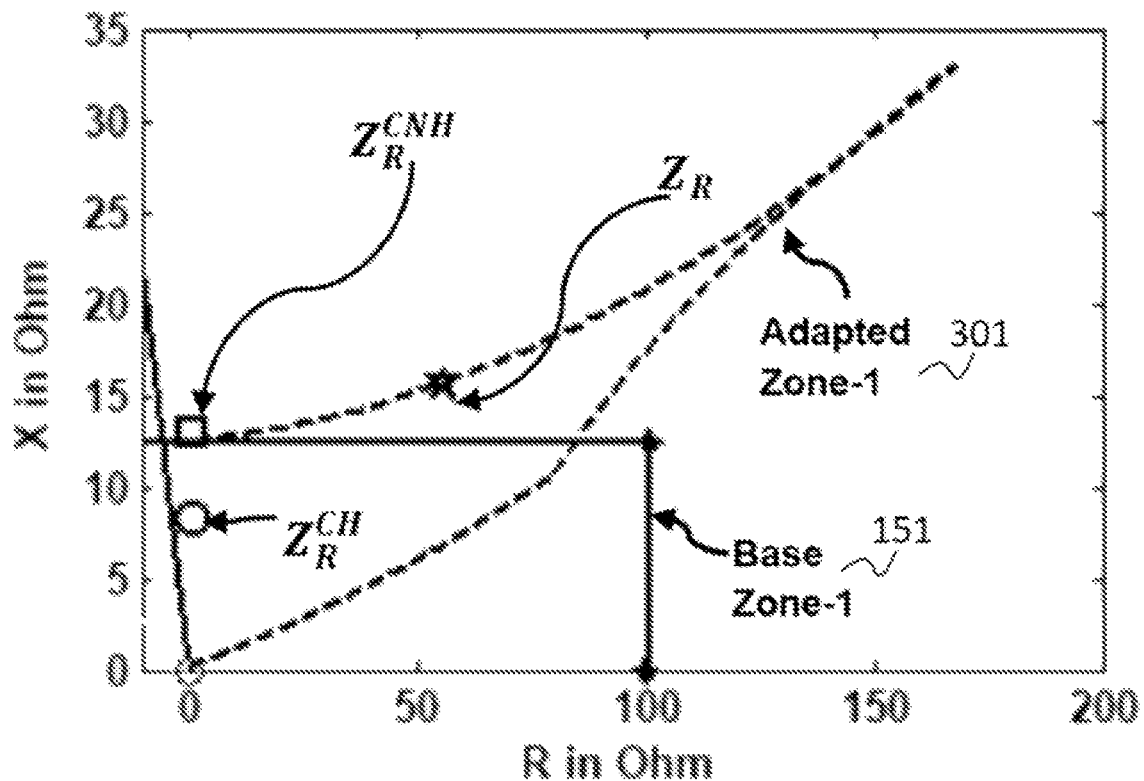
FIG. 10b) illustrates an operating characteristic of the distance protection according to an embodiment of the present disclosure.

FIG. 10a) illustrates voltage and current measurements at a relay located along a transmission line according to an embodiment of the present disclosure and FIG. 10b) illustrates an operating characteristic of the distance protection according to an embodiment of the present disclosure. In particular, FIG. 10a) illustrates the voltage and current waveforms seen at the relay terminal 'M' 110 when the fault occurs at 1.4 s. FIG. 10b) illustrates the position of the apparent impedance $Z_R$ with respect to the base relay characteristics 151 (or equivalently the first base boundary 151). This fault is lying outside of the base Zone-1 trip boundary 151 of the relay and falls within Zone-2 152.

First, a homogeneous system is considered. The angle $\phi_A$ is estimated by approximating $\arg(I_f)$ to be equal to arg $(\Delta I_{Ma1})$. This approximation results in $\phi_A = 7.5634°$. However, computing $\phi_A$ from the simulated measurements yields $\phi_A = 1.7662°$. Again, the error introduced in $\phi_A$ due to the approximation. The approximate $\phi_A$ is then used in eq.(9) to calculate the compensated apparent impedance $Z_R^c$ which is found to be $0.7894+j8.2887\Omega$. This is also plotted in FIG. 10b) as the homogeneous-system compensated apparent impedance $Z_R^{CH}$. The faulted line impedance $dZ_{1L}$ for this case is $1.3331+j14.0\Omega$. It is clear that $Z_R^{CH}$ is a poor approximation to the faulted line impedance, which can be owed to the homogeneity assumption. Moreover, $Z_R^{CH}$ is found to be lying within the base Zone-1 boundary 151. Accordingly, the fault location is incorrectly determined to be within Zone-1 131 and the distance protection system and/or the distance relay 111 is controlled. This illustrates that depending simply on a homogeneity-based correction of the apparent impedance $Z_R$ can also lead to relay maloperations.

Figure 10C:
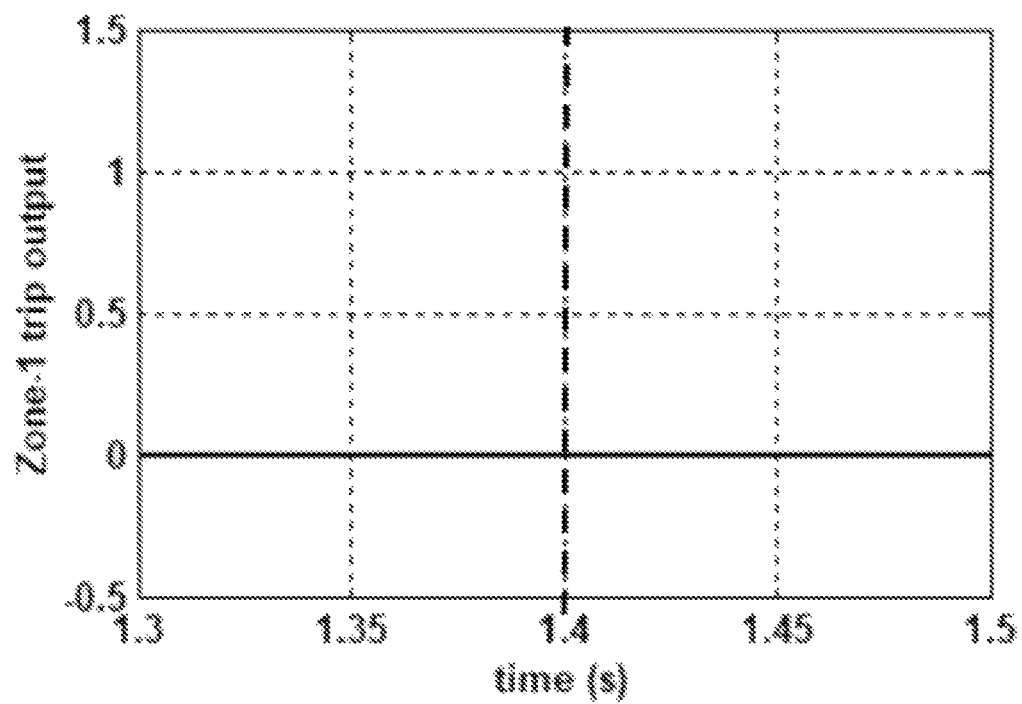
FIG. 10c) illustrates a trip output for a zone of a transmission line protected by the distance protection according to an embodiment of the present disclosure.
Figure 10D:
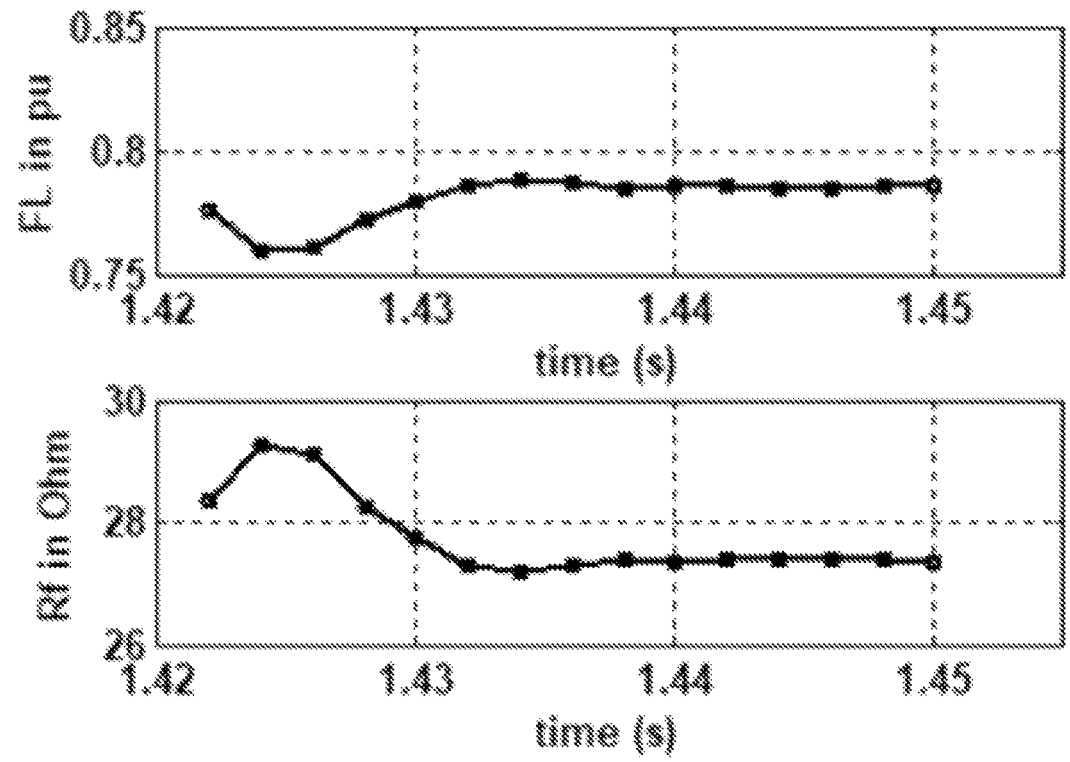
FIG. 10d) illustrates an output of a single-ended fault locator of the distance protection according to an embodiment of the present disclosure.

Alternatively, an inhomogeneous system is considered, which will invoke the fault location estimation, as in block 663, in order to calculate the compensated apparent impedance $Z_R^c$, according to block 664. The result of the fault location estimation module is shown in 10d), using which $Z_R^c$ is found to be $1.2212+j12.8225\Omega$ based on (10). This is plotted in FIG. 10b) as the inhomogeneous-system compensated apparent impedance $Z_R^{CNH}$. This value of $Z_R^{CNH}$ is indeed a good approximation to the faulted line impedance and therefore aids the distance protection system and/or at least one distance relay to make a more reliable decision when this $Z_R^{CNH}$ is compared against the base Zone-1 trip boundary 151. The distance protection system and/or the at least one distance relay correctly identifies the out-of-zone fault and Zone-1 trip output remains at 0, as illustrated in FIG. 10c). The fault will then be cleared by the relay in Zone-2. The method of FIG. 6, in particular the internal adaptive calculation block 660, does not interfere or delay the Zone-2 operation as it is anyways stipulated to happen only after a co-ordination interval of (typically) 20 cycles post the fault detection. According to an embodiment, the method of FIG. 6 is applied for any other fault types, other than phase-to-ground faults, such as phase-to-phase, phase-to-phase-to-ground and three phase faults by using the appropriate approximation formula of (7) and/or the appropriate single-ended fault location technique.

Figure 11A:
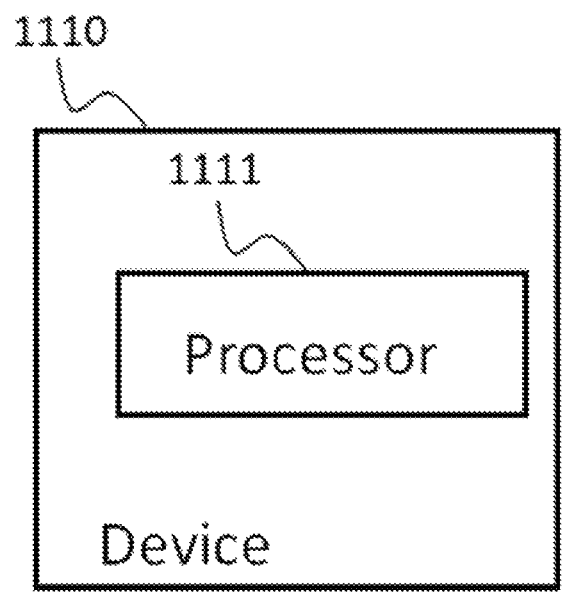
FIG. 11a) illustrates a device according to an embodiment of the present disclosure.

FIG. 11a) illustrates a device according to an embodiment of the present disclosure. The device 1110 is a device for controlling a distance protection system comprising a distance protection device located at a first position along a transmission line for an electrical power system, the device 1110 comprising a processor 1111 being configured to: receive measurements comprising current and/or voltage measurements; compute a first impedance from the received measurements; determine a fault location from the computed first impedance and a first impedance boundary; compute responsive to the determined fault location, a second impedance; re-determine the fault location from the computed second impedance and the first impedance boundary; and control the distance protection system from the determined fault location or the re-determined fault location.

According to an embodiment, the first impedance boundary is indicative of a first physical distance protected by the distance protection system. According to an embodiment, the first impedance boundary is indicative of a first physical distance being a distance between the first position and a second position along the transmission line.

According to an embodiment, the processor is further configured to re-determine the fault location from the computed first impedance and a second impedance boundary, wherein the second impedance boundary is computed from the measurements obtained before a fault at the fault location occurs and/or at least one impedance.

According to an embodiment, the processor is further configured to re-determine the fault location from the computed first impedance and a second impedance boundary, wherein the second impedance boundary is computed from at least one of the measurements obtained before a fault at the fault location occurs, at least one impedance of an equivalent model of a two-port equivalent across the transmission line, or a line impedance of the transmission line.

According to an embodiment, the second impedance boundary is indicative of an apparent distance protected by the distance protection system. According to an embodiment, the apparent distance is a distance between the first position and an apparent position along the transmission line in the presence of a resistive fault on the transmission line. According to an embodiment, the apparent position is the farthest possible position, in particular of a resistive fault on the transmission line, as perceived by the distance protection based on the computed first impedance or the calculation of eq.(1).

According to an embodiment, the computing the second impedance comprises: determining a homogeneity of the electrical power system, from at least one impedance; and approximating, by the distance protection device or the electrical power system, when the electrical power system is determined to be homogeneous, the second impedance from the at least one impedance; or estimating, when the electrical power system is determined to be non-homogeneous, the fault location from the received measurements and the at least one impedance; and computing the second impedance from the estimated fault location.

According to an embodiment, the computing the second impedance comprises: determining a homogeneity of the electrical power system, from at least one impedance of an equivalent model of a two-port equivalent across the transmission line and a line impedance of the transmission line; and approximating, by the distance protection device or the electrical power system, when the electrical power system is determined to be homogeneous, the second impedance from the at least one impedance of the equivalent model of the two-port equivalent across the transmission line and the line impedance of the transmission line; or estimating, when the electrical power system is determined to be non-homogeneous, the fault location from the measurements received at the first position, the at least one impedance of the equivalent model of the two-port equivalent across the transmission line, and the line impedance of the transmission line; and computing the second impedance from the estimated fault location.

According to an embodiment, the computing the second impedance comprises: determining a homogeneity of the electrical power system, from at least one of at least one impedance of an equivalent model of a two-port equivalent across the transmission line or a line impedance of the transmission line; and approximating, by the distance protection device or the electrical power system, when the electrical power system is determined to be homogeneous, the second impedance from at least one of the at least one impedance of the equivalent model of the two-port equivalent across the transmission line or the line impedance of the transmission line; or estimating, when the electrical power system is determined to be non-homogeneous, the fault location from at least one of the measurements received at the first position, the at least one impedance of the equivalent model of the two-port equivalent across the transmission line, or the line impedance of the transmission line; and computing the second impedance from the estimated fault location.

According to an embodiment, the approximating the second impedance is based on a homogeneity-based approximation of the phase angle of a third impedance. According to an embodiment, the third impedance is a deviation of the first impedance from impedance of the faulted segment of the line due to fault resistance. According to an embodiment, the impedance of the faulted segment of the line is a proportion of the line impedance falling in between the first position and the position of the fault on the transmission line.

According to an embodiment, the at least one impedance is or comprises: a line impedance of the transmission line; or at least one impedance of an equivalent model of a two-port equivalent across the transmission line.

According to an embodiment, the at least one impedance is updated, by the distance protection or the electrical power system, from the measurements obtained before a fault at the fault location occurs.

According to an embodiment, the equivalent model of the two-port equivalent across the transmission line is estimated and/or updated, by the distance protection or the electrical power system, from the measurements obtained before a fault at the fault location occurs.

According to an embodiment, a fault at the fault location is a resistive fault.

According to an embodiment, the first physical distance is a distance between the first position and a second position along the transmission line.

According to an embodiment, the determining the fault location from the computed first impedance and the first impedance boundary comprises: determining whether the computed first impedance is inside of the first impedance boundary.

According to an embodiment, the processor is further configured to: determine when the computed first impedance is inside of the first impedance boundary, the fault location is inside of the first physical distance.

According to an embodiment, the re-determining the fault location from the computed first impedance and the second impedance boundary comprises: determining whether the computed first impedance is inside of the second impedance boundary.

According to an embodiment, the processor is further configured to: determine when the computed first impedance is outside of the second impedance boundary, the fault location is outside of the first physical distance.

According to an embodiment, the re-determining the fault location from the computed second impedance and the first impedance boundary comprises: determining whether the computed second impedance is inside of the first impedance boundary.

According to an embodiment, the processor is further configured to: determine when the computed second impedance is inside of the first impedance boundary, the fault location is inside of the first physical distance.

Figure 11B:
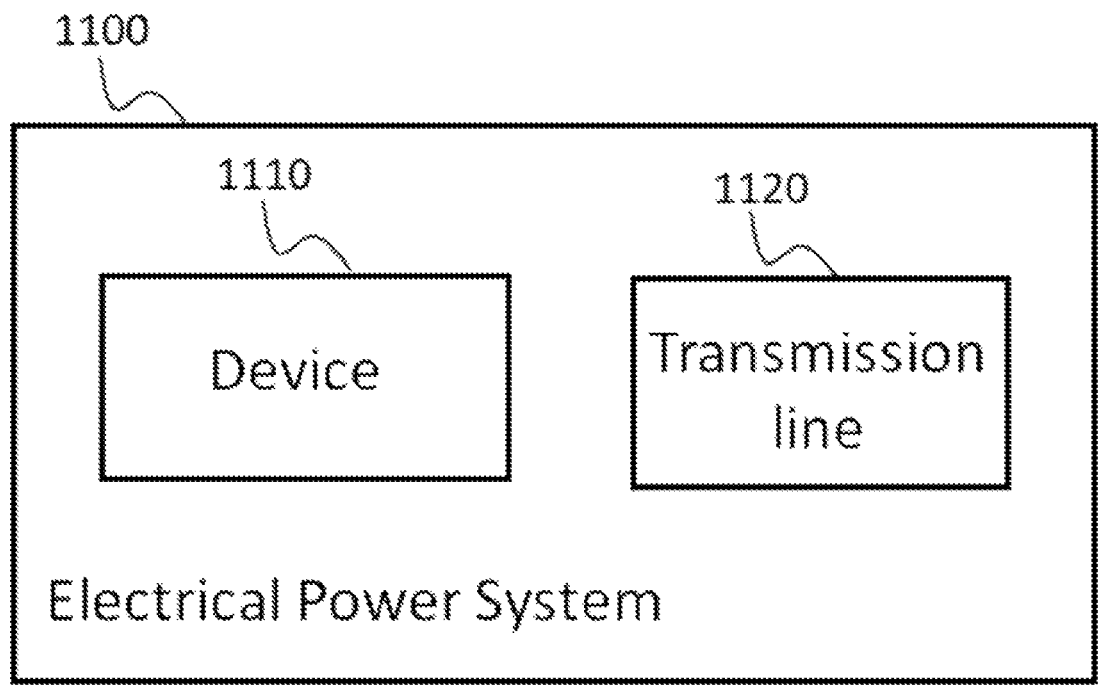
FIG. 11b) illustrates an electrical power system according to an embodiment of the present disclosure.

FIG. 11b) illustrates an electrical power system according to an embodiment of the present disclosure. The electrical power system 1100 comprises a transmission line 1120 being protected by the distance protection system controlled by the device 1110 and the device 1110 comprising a processor 1111 being configured to perform any one of the above-described embodiments.

In the following, exemplary embodiments of the disclosure will be described. It is noted that some aspects of any one of the described embodiments may also be found in some other embodiments unless otherwise stated or obvious. However, for increased intelligibility, each aspect will only be described in detail when first mentioned and any repeated description of the same aspect will be omitted.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A skilled person would further appreciate that any of the various illustrative logical blocks, units, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software unit"), or any combination of these techniques.

To clearly illustrate this interchangeability of hardware, firmware and software, various illustrative components, blocks, units, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, unit, etc. can be configured to perform one or more of the functions ort methods described herein. The term "configured to" or "configured for" as used herein with respect to a specified operation or function refers to a processor, device, component, circuit, structure, machine, unit, etc. that is physically constructed, programmed and/or arranged to perform the specified operation or function.

Furthermore, a skilled person would understand that various illustrative methods, logical blocks, units, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, units, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein. If implemented in software, the functions can be stored as one or more instructions or code on a computer-readable medium. Thus, the steps of a method or algorithm disclosed herein can be implemented as software stored on a computer-readable medium.

Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

Additionally, memory or other storage, as well as communication components, may be employed in embodiments of the present disclosure. It will be appreciated that, for clarity purposes, the above description has described embodiments of the present disclosure with reference to different functional units and processors. However, it will be apparent that any suitable distribution of functionality between different functional units, processing logic elements or domains may be used without detracting from the present disclosure. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A method for controlling a distance protection system, the method comprising:
   receiving, measurements comprising current and/or voltage measurements at a first position along a transmission line for an electrical power system;
   computing a first impedance from the received measurements;
   determining a fault location from the computed first impedance and a first impedance boundary;
   computing, responsive to the determined fault location, a second impedance;
   re-determining the fault location from the computed second impedance and the first impedance boundary; and
   controlling the distance protection system from the determined fault location or the re-determined fault location,
   wherein computing the second impedance comprises:
   determining a homogeneity of the electrical power system, from at least one impedance of an equivalent model of a two-port equivalent across the transmission line and a line impedance of the transmission line; and approximating, when the electrical power system is determined to be homogeneous, the second impedance from the at least one impedance of the equivalent model of the two-port equivalent across the transmission line and the line impedance of the transmission line; or estimating, when the electrical power system is determined to be non-homogeneous, the fault location from the measurements received at the first position, the at least one impedance of the equivalent model of the two-port equivalent across the transmission line, and the line impedance of the transmission line; and computing the second impedance from the estimated fault location.

2. The method of claim 1, further comprising re-determining the fault location from the computed first impedance and a second impedance boundary.

3. The method of claim 2, wherein the second impedance boundary is computed from the measurements obtained before a fault at the fault location occurs.

4. The method of claim 2, wherein the second impedance boundary is computed from at least one impedance of an equivalent model of a two-port equivalent across the transmission line.

5. The method of claim 4, wherein the equivalent model of the two-port equivalent across the transmission line is estimated and/or updated from the measurements obtained before a fault at the fault location occurs.

6. The method of claim 2, wherein the second impedance boundary is computed from a line impedance of the transmission line.

7. The method of claim 2, wherein the first impedance boundary is indicative of a first physical distance being a distance between the first position and a second position along the transmission line.

8. The method of claim 7, further comprising determining, when the computed first impedance is inside of the first impedance boundary, the fault location is inside of the first physical distance.

9. The method of claim 8, wherein the determining the fault location from the computed first impedance and the first impedance boundary comprises determining whether the computed first impedance is inside of the first impedance boundary.

10. The method of claim 7, wherein the re-determining the fault location from the computed first impedance and the second impedance boundary comprises determining whether the computed first impedance is inside of the second impedance boundary.

11. The method of claim 10, further comprising determining, when the computed first impedance is outside of the second impedance boundary, the fault location is outside of the first physical distance.

12. The method of claim 7, wherein the re-determining the fault location from the computed second impedance and the first impedance boundary comprises determining whether the computed second impedance is inside of the first impedance boundary.

13. The method of claim 12, further comprising determining, when the computed second impedance is inside of the first impedance boundary, the fault location is inside of the first physical distance.

14. The method of claim 7, wherein the determining the fault location from the computed first impedance and the first impedance boundary comprises determining whether the computed first impedance is inside of the first impedance boundary.

15. The method of claim 1, wherein the determining the fault location from the computed first impedance and the first impedance boundary comprises determining whether the computed first impedance is inside of the first impedance boundary.

16. A device for controlling a distance protection system comprising a distance protection device located at a first position along a transmission line for an electrical power system, the device comprising a processor being configured to:

receive measurements comprising current and/or voltage measurements at a first position along a transmission line for an electrical power system;

compute a first impedance from the received measurements;

determine a fault location from the computed first impedance and a first impedance boundary;

compute, responsive to the determined fault location, a second impedance;

re-determine the fault location from the computed second impedance and the first impedance boundary; and control the distance protection system from the determined fault location or the re-determined fault location, wherein compute the second impedance comprises:

determining a homogeneity of the electrical power system, from at least one impedance of an equivalent model of a two-port equivalent across the transmission line and a line impedance of the transmission line; and approximating, when the electrical power system is determined to be homogeneous, the second impedance from the at least one impedance of the equivalent model of the two-port equivalent across the transmission line and the line impedance of the transmission line; or estimating, when the electrical power system is determined to be non-homogeneous, the fault location from the measurements received at the first position, the at least one impedance of the equivalent model of the two-port equivalent across the transmission line, and the line impedance of the transmission line; and computing the second impedance from the estimated fault location.

17. The device of claim 16, wherein the processor is further configured to re-determine the fault location from the computed first impedance and a second impedance boundary, wherein the second impedance boundary is computed from at least one of the measurements obtained before a fault at the fault location occurs, at least one impedance of an equivalent model of a two-port equivalent across the transmission line, or a line impedance of the transmission line.

18. An electrical power system comprising a transmission line and the device of claim 16.

* * * * *

UNITED STATES PATENT AND TRADEMARK OFFICE
CERTIFICATE OF CORRECTION

| | |
|---|---|
| PATENT NO. | : 12,288,979 B2 |
| APPLICATION NO. | : 18/132789 |
| DATED | : April 29, 2025 |
| INVENTOR(S) | : Vedanta Pradhan and Od Naidu |

It is certified that error appears in the above-identified patent and that said Letters Patent is hereby corrected as shown below:

On the Title Page

In Item (73), under "Assignee", delete "HITACHI ENERGY LTO" and insert --HITACHI ENERGY LTD--.

Signed and Sealed this
Third Day of June, 2025

Coke Morgan Stewart
*Acting Director of the United States Patent and Trademark Office*